(12) United States Patent
Wang et al.

(10) Patent No.: US 11,561,134 B2
(45) Date of Patent: Jan. 24, 2023

(54) COMPRESSED-SENSING ULTRAFAST SPECTRAL PHOTOGRAPHY SYSTEMS AND METHODS

(71) Applicant: California Institute of Technology, Pasadena, CA (US)

(72) Inventors: Lihong Wang, Arcadia, CA (US); Peng Wang, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 85 days.

(21) Appl. No.: 17/030,056

(22) Filed: Sep. 23, 2020

(65) Prior Publication Data

US 2021/0088384 A1    Mar. 25, 2021

Related U.S. Application Data

(60) Provisional application No. 62/904,442, filed on Sep. 23, 2019.

(51) Int. Cl.
| | | |
|---|---|---|
| *G01J 3/28* | (2006.01) | |
| *G01S 17/89* | (2020.01) | |
| *H04N 19/593* | (2014.01) | |
| *H04N 19/503* | (2014.01) | |
| *H03M 7/30* | (2006.01) | |

(52) U.S. Cl.
CPC ............. *G01J 3/2823* (2013.01); *G01S 17/89* (2013.01); *H03M 7/3062* (2013.01); *H04N 19/503* (2014.11); *H04N 19/593* (2014.11)

(58) Field of Classification Search
CPC . G01J 3/2823; G01J 2003/2826; G01S 17/89; H03M 7/3059
See application file for complete search history.

(56) References Cited

U.S. PATENT DOCUMENTS

| | | | |
|---|---|---|---|
| 7,859,679 | B2 | 12/2010 | Bouma et al. |
| 9,645,377 | B2 | 5/2017 | Bosworth et al. |
| 10,473,916 | B2 | 11/2019 | Wang et al. |
| 10,992,924 | B2 | 4/2021 | Wang et al. |
| 2001/0017727 | A1 | 8/2001 | Sucha et al. |
| 2011/0260036 | A1 | 10/2011 | Baraniuk et al. |
| 2013/0046175 | A1 | 2/2013 | Sumi |
| 2016/0157828 | A1 | 6/2016 | Sumi et al. |
| 2017/0163971 | A1 | 6/2017 | Wang et al. |
| 2018/0224552 | A1 | 8/2018 | Wang et al. |
| 2020/0288110 | A1 | 9/2020 | Wang et al. |
| 2022/0247908 | A1 | 8/2022 | Wang et al. |

OTHER PUBLICATIONS

Notice of Allowance dated Sep. 23, 2020 issued in U.S. Appl. No. 16/810,630.

Aghababaei Nejad, et al., "Polarization investigation of laser-induced breakdown plasma emission from Al, Cu, Mo, W, and Pb elements using nongated detector," J. Laser Appl. 30, 022005 (2018).

(Continued)

*Primary Examiner* — Maurice C Smith
(74) *Attorney, Agent, or Firm* — Sheila Martinez-Lemke; Weaver Austin Villeneuve & Sampson LLP

(57) ABSTRACT

Among the various aspects of the present disclosure is the provision of systems and methods of compressed-sensing ultrafast spectral photography.

23 Claims, 13 Drawing Sheets

(56) References Cited

OTHER PUBLICATIONS

Astapenko, V., et al., "Polarization mechanism for bremsstrahlung and radiative recombination in a plasma with heavy ions," Plasma Phys. Rep. vol. 28, No. 4, (2002) pp. 303-311.

Baker, et al., High resolution imaging of photosynthetic activities of tissues, cells and chloroplasts in leaves, J. Exp. Bot. 52, 615-621 (2001).

Balistreri, et al., "Tracking Femtosecond Laser Pulses in Space and Time" Science 294, 1080-1082 (2001).

Barty, A. et al. "Ultrafast single-shot diffraction imaging of nanoscale dynamics" Nature Photonics 2, 415-419 (2008).

Batabyal, S. et al. "Label-free optical detection of action potential in mammalian neurons," Biomedical Optics Express 8, (2017) pp. 3700-3713.

Bergmann, et al., "Multiwavelength fluorescence lifetime imaging by TCSPC" Proc. SPIE, Advanced Photon Counting Techniques, vol. 6372, (2006) pp. 637204-1-637204-6.

Berezin, et al., "Fluorescence Lifetime Measurements and Biological Imaging" Chemical Reviews 110, pp. 2641-2684 (2010).

Bindhu, S. et al., "Measurement of the absolute fluorescence quantum yield of rhodamine B solution using a dual-beam thermal lens technique," Journal of Physics D: Applied Physics 29, (1996) pp. 1074-1079.

Bioucas-Dias, et al., "A new TwIST: two-step iterative shrinkage/thresholding algorithms for image restoration," IEEE Trans. Image Process. 16, 2992-3004 (2007).

Bonse, J., et al., "Time-and space-resolved dynamics of melting, ablation, and solidification phenomena induced by femtosecond laser pulses in germanium," Phys. Rev. B 74, 134106 (2006).

Bosworth, B. T. et al., "High-speed flow microscopy using compressed sensing with ultrafast laser pulses," Opt. Express 23, 10521-10532 (2015).

Bowlan, P., et al., "Measuring the spatiotemporal electric field of tightly focused ultrashort pulses with sub-micron spatial resolution" Optics Express 16, 13663-13675 (2008).

Bradley, et al. "High-speed gated x-ray imaging for ICF target experiments (invited)" Review of Scientific Instruments 63(10), Oct. 1992, pp. 4813-4817.

Brennen, C.E., "Cavitation and Bubble Dynamics" California Institute of Technology, Oxford University Press, (1995) pp. 1-294.

Brenner, et al., "Single-bubble sonoluminescence," Rev. Mod. Phys. 74,425 (2002).

Brinks, D., Klein, A. J. & Cohen, A. E., "Two-photon lifetime imaging of voltage indicating proteins as a probe of absolute membrane voltage," Biophys. J. 109, 914-921 (2015).

Bub, G., et al., "Temporal pixel multiplexing for simultaneous high-speed, high-resolution imaging," Nat. Methods 7,209 (2010).

Byun, et al., "A Model of Laser-Induced Cavitation" Japanese Journal of Applied Physics 43, (2004) pp. 621-630.

Cadby, A., et al., "Mapping the Fluorescence Decay Lifetime of a Conjugated Polymer in a Phase-Separated Blend Using a Scanning Near-Field Optical Microscope" Nano Letters vol. 5, No. 11, (2005) pp. 2232-2237.

Campbell, J.B. & Wynne, R.H., "Introduction to Remote Sensing," Fifth Edition, Guilford Press (2011) pp. 1-23. [ISBN 978-1-60918-176-5].

Candes, E. J., "The restricted isometry property and its implications for compressed sensing," C.R. Math. 346, 589-592 (2008).

Chang, D. E., "Quantum nonlinear optics—photon by photon" Nature Photonics 8, 685-694 (2014).

Chen, M., et al., "3D differential phase contrast microscopy" Biomedical Optics Express 7, (2016) pp. 3940-3950.

Choi, W. et al. "Tomographic phase microscopy" Nature Methods 4, 717 (2007) pp. 1-3.

Corsi, M. et al., "Temporal and spatial evolution of a laser-induced plasma from a steel target," Appl. Spectrosc. 57, 715-721 (2003).

Cotte, Y. et al. "Marker-free phase nanoscopy" Nature Photonics 7, 113 (2013) pp. 1-5.

Davis, T. J., et al., "Phase-contrast imaging of weakly absorbing materials using hard X-rays," Nature 373, pp. 595-598 (1995).

De Giacomo, et al., "Laser-induced plasma emission: from atomic to molecular spectra" J. Phys. D: Appl. Phys. 50 (2017) 183002 (17pp).

De Lucia Jr, F. C., et al., Current status of standoff LIBS security applications at the United States Army Research Laboratory (2009).

Dikmelik, et al., "Femtosecond and nanosecond laser-induced breakdown spectroscopy of trinitrotoluene," Opt. Express 16, 5332-5337 (2008).

Ehn, A. et al., "FRAME: femtosecond videography for atomic and molecular dynamics," Light Sci Appl. 6, el 7045 (2017).

El-Desouki, M. et al. "CMOS Image Sensors for High Speed Applications" Sensors 9, 430-444 (2009).

Etoh, G. T. et al. "The Theoretical Highest Frame Rate of Silicon Image Sensors" Sensors 17, 483 (2017).

Farber, et al., "Compressive 4D spectra-volumetric imaging," Optics Letters vol. 41, No. 22, Nov. 15, 2016, pp. 5174-5177.

Ferraro, J. R., "Introductory Raman spectroscopy, 2nd Ed." Academic press (2003) pp. 1-195. <ISBN:978-0-12-254105-6> [Part I].

Ferraro, J. R., "Introductory Raman spectroscopy, 2nd Ed." Academic press (2003) pp. 196-434. <ISBN:978-0-12-254105-6> [Part 2].

Fuller, P. "An introduction to high-speed photography and photonics," Imaging Sci. J. 57, 293-302 (2009).

Gabolde, et al., "Single-frame measurement of the complete spatiotemporal intensity and phase of ultrashort laser pulses using wavelength-multiplexed digital holography" The Journal of the Optical Society of America B 25, (2008) pp. A25-A33.

Gabolde, et al., "Single-shot measurement of the full spatiotemporal field of ultrashort pulses with multi-spectral digital holography" Optics Express 14, 11460-11467 (2006).

Gage, S. H. "Modem dark-field microscopy and the history of its development" Transactions of the American Microscopical Society vol. 39, No. 2, Apr. 1920, pp. 95-141.

Gao and Wang, "A review of snapshot multidimensional optical imaging: measuring photon tags in parallel" Phys Rep., Feb. 29, 2016, vol. 616, pp. 1-37. <doi:10.1016/j.physrep.2015.12.004>.

Gao, et al., "Single-shot compressed ultrafast photography at one hundred billion frames per second," Nature 516(7529) 74-77 (2014).

Gao, G. et al., "Ultrafast all-optical solid-state framing camera with picosecond temporal resolution," Opt. Express 25, 8721-8729 (2017).

Gao, L., "Compact Image Slicing Spectrometer (ISS) for hyperspectral fluorescence microscopy," Opt. Express 17, 12293-12308 (2009).

Gorkic, et al., "Analysis of sonic waves generated during laser engraving of printed circuits," Int. J. Adv. Manuf. Technol. 42, 138-144 (2009).

Gosta, M. & Grgic, M., "Accomplishments and challenges of computer stereo vision," 52nd Intl. Symp. ELMAR-2010, Sep. 15-17, 2010, Zadar, Croatia, pp. 57-64.

Gruev, et al., "Dual-tier thin film polymer polarization imaging sensor," Opt. Express 18, 19292-19303 (2010).

Gruev, V., et al., "CCD polarization imaging sensor with aluminum nanowire optical filters," Opt. 13 Express 18, p. 19087-19094 (2010).

Hamamatsu Photonics K.K. "Guide To Streak Cameras" Hamamatsu Corp., Hamamatsu City, Japan, 2008, pp. 1-12. <www.hamamatsu.com>.

Hawking, S. W. "Gravitational Radiation from Colliding Black Holes" Physical Review Letters 26, (1971) pp. 1344-1346.

Heikkila, J. & Silven, 0., "A four-step camera calibration procedure with implicit image correction," Proceedings of IEEE Computer Society Conference on Computer Vision and Pattern Recognition, 1106-1112 (1997).

Herink, G., et al., "Real-time spectral interferometry probes the internal dynamics of femtosecond soliton molecules" Science 356, 50-54 (2017).

Heist, S., et al., "High-speed 3D shape measurement by GOBO projection of aperiodic sinusoidal fringes: a performance analysis," Proc. SPIE 10667-106670A (2018).

Heshmat, et al., "Single-shot ultrafast imaging using parallax-free alignment with a tilted lenslet array," CLEO: 2014 STu3E.7 (2014).

(56) References Cited

OTHER PUBLICATIONS

Hirschmuller, H., "Accurate and efficient stereo processing by semi-global matching and mutual information," 2005 IEEE Computer Society Conference on Computer Vision and Pattern Recognition (CVPR'05) 807-814 (2005).
Hirschmuller, H., "Stereo processing by semiglobal matching and mutual information," IEEE Trans. Pattern Anal. Mach. Intell. 30, 328-341 (2008).
Hori, et al., "Laser-Induced Breakdown Plasma Observed using a Streak Camera," Jpn. J. Appl. Phys. 47, 4759 (2008).
Horstmeyer, et al., "Diffraction tomography with Fourier ptychography" Optica 3, (2016) pp. 827-835.
Hunt, J. et al., "Metamaterial Apertures for Computational Imaging," Science 339, 310-313 (2013).
Jagadeesh, G. et al. "Needleless vaccine delivery using micro-shock waves" Clinical and vaccine immunology: CVI 18, (2011) pp. 539-545.
Jiang, H. et al. "Quantitative 3D imaging of whole, unstained cells by using X-ray diffraction microscopy" Proceedings of the National Academy of Sciences 107, 11234-11239 (2010).
Jiang, X. et al. "Chaos-assisted broadband momentum transformation in optical microresonators" Science 358, 344-347 (2017).
Johnsen, S. et al., "Polarization vision seldom increases the sighting distance of silvery fish," Current Biology 26, R752-R754 (2016).
Jung, J. et al. "Label-free non-invasive quantitative measurement of lipid contents in individual microalgal cells using refractive index tomography," Scientific Reports 8, 6524 (2018) pp. 1-10.
Kakue, et al., "Digital Light-in-Flight Recording by Holography by Use of a Femtosecond Pulsed Laser" IEEE Journal of Selected Topics in Quantum Electronics vol. 18, No. 1, Jan./Feb. 2012, pp. 479-485.
Kandel, M. E. et al. "Three-dimensional intracellular transport in neuron bodies and neurites investigated by label-free dispersion-relation phase spectroscopy" Cytometry Part A 91, (2017) pp. 519-526.
Kim, et al., "Picosecond-resolution phase-sensitive imaging of transparent objects in a single shot," Science Advances 6(3) eaay6200 (2020).
Kim, G. et al. "Measurements of three-dimensional refractive index tomography and membrane deformability of live erythrocytes from Pelophylax nigromaculatus," Scientific Reports 8, 9192 (2018) pp. 1-8.
Kim, K. et al., "Tomographic active optical trapping of arbitrarily shaped objects by exploiting 3D refractive index maps," Nature Communications 8, 15340 (2017) pp. 1-8.
Kim, T. et al. White-light diffraction tomography of unlabelled live cells. Nature Photonics 8, 256 (2014) pp. 1-20.
Kodama, R. et al. "Fast heating of ultrahigh-density plasma as a step towards laser fusion ignition" Nature 412, (2001) pp. 798-802.
Kodama, R., et al. "Development of a two-dimensional space-resolved high-speed sampling camera," Rev. Sci. Instrum. 70, (1999) pp. 625-628.
Komatsu, et al. "Dependence of reconstructed image characteristics on the observation condition in light-in-flight recording by holography" The Journal of the Optical Society of America A, vol. 22, No. 8, Aug. 2005, pp. 1678-1682.
Lazaros, N., Sirakoulis, G. C. & Gasteratos, A., "Review of stereo vision algorithms: from software to hardware," Int. J. Optomechatronics 2, 435-462 (2008).
Le Blanc, et al., "Single-shot measurement of temporal phase shifts by frequency-domain holography" Optics Letters 25, (2000) pp. 764-766.
Leuthold, J., et al., "Nonlinear silicon photonics" Nature Photonics 4, (2010) pp. 535-544.
Li, Z. et al. "Single-Shot Visualization of Evolving Laser Wakefields Using an All-Optical Streak Camera," Physical Review Letters 113, (2014) p. 085001-1-085001-5.
Li, Z., et al., "Single-shot tomographic movies of evolving light-velocity objects," Nat. Commun. 5, 3085 (2014).
Liang et al., "Single-shot real-time video recording of a photonic Mach cone induced by a scattered light pulse" Science Advances, Jan. 20, 2017, vol. 3:e1601814, pp. 1-7.
Liang, et al., "Encrypted three-dimensional dynamic imaging using snapshot time-of-flight compressed ultrafast photography," Scientific Reports 5(15504) (2015) pp. 1-10.
Liang, et al., "Homogeneous one-dimensional optical lattice generation using a digital micromirror devicebased high-precision beam shaper," J Micro. Nanolithogr. MEMS MOEMS 11, 023002 (2012).
Liang, et al., "Single-shot real-time femtosecond imaging of temporal focusing," Light-Science & Applications 7(1) 42 (2018).
Liang, J. andWang, L. V., "Single-shot ultrafast optical imaging," Optica 5, 1113-1127 (2018).
Liang, J., et al., "Grayscale laser image formation using a programmable binary mask," Opt. Eng. 51, 108201 (2012).
Liu, X., et al., "Singleshot compressed optical-streaking ultra-high-speed photography," Optics Letters 44, 1387-1390, (2019).
Liu, X., "Single-shot real-time sub-nanosecond electron imaging aided by compressed sensing: Analytical modeling and simulation" Micron 117, 47-54 (2019).
Llull, et al., "Coded aperture compressive temporal imaging," Optics Express 21, 10526-10545 (2013).
Lohse, et al., "Snapping shrimp make flashing bubbles" Nature 413, 477-478 (2001). <https://doi.org/10.1038/35097152>.
Lu, Y., "Compressed ultrafast spectral-temporal photography" Phys. Rev. Lett. 122, (2019) pp. 193904-1-193904-4.
Luo, Y. et al., "Talbot holographic illumination nonscanning (THIN) fluorescence microscopy," Laser Photonics Rev. 8, L71-L75 (2014).
Majd, et al., "Polarization resolved laser induced breakdown spectroscopy by single shot nanosecond pulsed Nd: Y AG laser," Opt. Laser Eng. 48, (2010) pp. 750-753.
Markiewicz-Keszycka, et al., "Laser-induced breakdown spectroscopy (LIBS) for food analysis: a review," Trends Food, Sci. Technol. 65, (2017) pp. 80-93.
Marquet, P. et al. "Digital holographic microscopy: a noninvasive contrast imaging technique allowing quantitative visualization of living cells with subwavelength axial accuracy," Optics Letters 30, pp. 468-470 (2005).
Marquet, P., et al. "Review of quantitative phase-digital holographic microscopy: promising novel imaging technique to resolve neuronal network activity and identify cellular biomarkers of psychiatric disorders" vol. 1 (SPIE, 2014) pp. 020901-1-020901-15.
Matlis, N. H. et al. "Snapshots of laser wakefields" Nature Physics 2, 749-753 (2006).
Medhi, B., et al., "Shock-wave imaging by density recovery from intensity measurements" Applied Optics vol. 57, No. 15, May 20, 2018, pp. 4297-4308.
Merritt, D., et al., "Dark Matter Spikes and Annihilation Radiation from the Galactic Center" Physical Review Letters 88, 191301 (2002).
Michel, A. P., "Applications of single-shot laser-induced breakdown spectroscopy," Spectrochim. Acta B 65, 185-191 (2010).
Mikami, H., Gao, L. & Goda, K., "Ultrafast optical imaging technology: principles and applications of emerging methods," Nanophotonics 5, 98-110 (2016).
Milchberg, et al., "Polarization of recombination radiation from nonequilibrium plasmas," Physical Review A, vol. 26, No. 2, Aug. 1982, pp. 1023-1029.
Mochizuki, F. et al., "Single-event transient imaging with an ultra-high-speed temporally compressive multiaperture CMOS image sensor," Opt. Express 24, 4155-4176 (2016).
Morgner, et al. "Sub-two-cycle pulses from a Kerr-lens mode-locked Ti:sapphire laser" Optics Letters vol. 24, No. 6, (1999) pp. 411-413.
Momose, et al., "Phase-contrast X-ray computed tomography for observing biological soft tissues" Nature Medicine 2, 473-475 (1996).
Nakagawa, et al., "Sequentially timed all-optical mapping photography (STAMP)," Nat. Photon. 8, 695-700 (2014).
Ng, R. et al., "Light field photography with a hand-held plenoptic camera," Comput. Sci. Tech. Rep. 2, 1-11 (2005).

(56) References Cited

OTHER PUBLICATIONS

Nguyen, et al., "Gradient light interference microscopy for 3D imaging of unlabeled specimens" Nature Communications 8, 210 (2017) pp. 1-9.

Nomarski, G. & Weill, A. Application à la métallographic des méthodes interférentielles à deux ondes polarisées. Revue de métallurgie 52, 121-134 (1955).

Nordin, G. P., Meier, J. T., Deguzman, P. C. & Jones, M. W., "Micropolarizer array for infrared imaging polarimetry," J. Opt. Soc. Am. A 16, 1168-1174 (1999).

Oh, S. et al. "Label-Free Imaging of Membrane Potential Using Membrane Electromotility" Biophysical Journal 103, (2012) pp. 11-18.

Okabe, K. et al., "Intracellular temperature mapping with a fluorescent polymeric thermometer and fluorescence lifetime imaging microscopy," Nat. Commun. 3, 705 (2012) pp. 1-7.

Pégard, N. C. et al. Three-dimensional scanless holographic optogenetics with temporal focusing (3D-SHOT). Nature Communications 8, 1228 (2017) pp. 1-14.

Penczak Jr, et al., "The mechanism for continuum polarization in laser induced breakdown spectroscopy of Si (111)," Spectrochim. Acta B 74, 3-10 (2012).

Pian, Q., et al., "Compressive hyperspectral time-resolved widefield fluorescence lifetime imaging" Nat. Photon. 11, 411-414 (2017).

Pfeiffer, F. et al. "Hard-X-ray dark-field imaging using a grating interferometer" Nature Materials 7, 134 (2008).

Qian, Z. et al., "Structure, mechanical properties and surface morphology of the snapping shrimp claw," J. Mater. Sci. 53, 10666-10678 (2018).

Qian, B., et al., "Electron pulse broadening due to space charge effects in a photoelectron gun for electron diffraction and streak camera systems," Journal of Applied Physics 91, 462-468 (2002).

Rivenson, Yair, et al. "Multi-dimensional Imaging by Compressive Digital Holography." Chapt. 4, Multi-Dimensional Imaging (2014), pp. 75-99.

Rohrlich, D. et al., "Cherenkov radiation of superluminal particles" Physical Review A 66, 042102 (2002).

Rouan, D., et al., "The four-quadrant phase-mask coronagraph. I. Principle," Publications of the Astronomical Society of the Pacific 112, 1479 (2000).

Sabatke, D. S. et al., "Snapshot imaging spectropolarimeter," Opt. Eng. 41, (2002) pp. 1048-1055.

Santos Jr, D. et al. "Laser-induced breakdown spectroscopy for analysis of plant materials: a review" Spectrochim. Acta B 71, 3-13 (2012).

Sarafraz, et al., "Enhancing images in scattering media utilizing 72 stereovision and polarization," 2009 Workshop on Applications of Computer Vision (WACV) 1-8.

Selanger, et al., "Fluorescence lifetime studies of Rhodamine 6G in methanol," The Journal of Physical Chemistry 81, 1960-1963 (1977).

Serabyn, E., et al., "An image of an exoplanet separated by two diffraction beamwidths from a star" Nature 464, 1018 (2010).

Shen, Y. R. "The principles of nonlinear optics: Chapter 1" Wiley, 2003, Ch. 1 pp. 1-12.

Shin, S., et al., "Super-resolution three-dimensional fluorescence and optical diffraction tomography of live cells using structured illumination generated by a digital micromirror device," Scientific Reports 8, 9183 (2018) pp. 1-8.

Shiraga, H., et al., "Two-dimensional sampling-image x-ray streak camera for ultrafast imaging of inertial confinement fusion plasmas," Rev. Sci. Instrum. 70, 620-623 (1999).

Shrestha, S. et al. "High-speed multispectral fluorescence lifetime imaging implementation for in vivo applications" Optics Letters 35, 2558-2560 (2010).

Šiaulys, et al., "Direct holographic imaging of ultrafast laser damage process in thin films" Optics Letters vol. 39, No. 7, Apr. 1, 2014, pp. 2164-2167.

Solli, et al., "Optical rogue waves," Nature 450, Dec. 13, 2007, pp. 1054-1057.

Suzuki, T. et al. "Sequentially timed alloptical mapping photography (STAMP) utilizing spectral filtering," Opt. Express 23, 30512-30522 (2015).

Tamamitsu, M. et al. "Design for sequentially timed all-optical mapping photography with optimum temporal performance" Optics Letters vol. 40, No. 4, pp. 633-636 (2015).

Takeda, J. et al. "Time-resolved luminescence spectroscopy by the optical Kerr-gate method applicable to ultrafast relaxation processes" Physical Review B 62, pp. 10083-10087 (2000).

Tong, T., Li, J. & Longtin, J.P., Real-time control of ultrafast laser micromachining by laser-induced breakdown spectroscopy,Appl. Opt. 43, 1971-1980 (2004).

Tyo, J. S., "Hybrid division of aperture/division of a focalplane polarimeter for real-time polarization imagery without an instantaneous field-of-view error," Opt. Lett. 31, 2984-2986 (2006).

Velasco, E., "Ultrafast Camera Takes 1 Trillion Frames Per Second of Transparent Objects and Phenomena," Caltech, Jan. 17, 2020, pp. 1-2. <URL:https://www.caltech.edu/about/news/ultrafast-camera-takes-1-trillion-frames-second-transparent-objects-and-phenomena>.

Veysset, D. et al. Single-bubble and multibubble cavitation in water triggered by laser-driven focusing shock waves. Physical Review E 97, 053112 (2018).

Veysset, et al., "Interferometric analysis of laser-driven cylindrically focusing shock waves in a thin liquid layer" Scientific Reports 6, 24 (2016) pp. 1-7.

Vogel, et al., "Shock wave emission and cavitation bubble generation by picosecond and nanosecond optical breakdown in water" The Journal of the Acoustical Society of America 100, (1996) pp. 148-165.

Wang Jingge et al., "Temporal and Spatial Evolution of Laser-Induced Plasma from a Slag Sample" Plasma Sci. Technol. 17, 649 (2015) pp. 649-655.

Wang, P. & Menon, R., "Computational multispectral video imaging," J. Opt. Soc. Am. A 35, pp. 189-199 (2018).

Wang, P. & Menon, R., "Ultra-high-sensitivity color imaging via a transparent diffractive-filter array and computational optics," Optica 2, pp. 933-939 (2015).

Wetzstein, et al., "On plenoptic multiplexing and reconstruction," Int. J. Comput. Vis. 101, 384-400 (2013).

Wu, J.-L. et al., "Ultrafast laser-scanning time-stretch imaging at visible wavelengths," Light Sci. Appl. 6, e16196 (2017).

Yang, C. et al., "Optimizing codes for compressed ultrafast photography by the genetic algorithm," Optica 5, 147-151 (2018).

Yang, et al., "Compressed ultrafast photography by multi-encoding imaging," Laser Physics Letters 15(11) 116202 (2018).

Yeola, S., Kuk, D. & Kim, K.-Y., "Single-shot ultrafast imaging via spatiotemporal division of femtosecond laser pulses," J. Opt. Soc. Am. B 35, (2018) pp. 2822-2827.

Yu, Z., et al., "Efficiency and temporal response of crystalline Kerr media in collinear optical Kerr gating" Optics Letters vol. 36, No. 15, Aug. 1, 2011, pp. 2904-2906.

Yue, Q.-Y., et al., "One-shot time-resolved holographic polarization microscopy for imaging laser-induced ultrafast phenomena" Optics Express 25, 14182-14191 (2017).

Zdora, et al., "X-ray Phase-Contrast Imaging and Metrology through Unified Modulated Pattern Analysis" Physical Review Letters 118, 203903 (2017).

Zeng, X. et al. "High-resolution single-shot ultrafast imaging at ten trillion frames per second" arXiv:1807.00685 (2018).

Zernike, F. "How I discovered phase contrast" Science 121, Mar. 11, 1955, pp. 345-349. <URL:http://www.jstor.org/stable/1682470>.

Zewail, A. H. "Four-Dimensional Electron Microscopy" Science 328, 187-193 (2010).

Zhao, Y., et al., "Polarization-resolved laser-induced breakdown spectroscopy," Opt. Lett. 34, 494-496 (2009).

Zhou, R., et al., "Detecting 20 nm Wide Defects in Large Area Nanopatterns Using Optical Interferometric Microscopy" Nano Letters 13, 3716-3721 (2013).

Zhu, B., et al., "Image reconstruction by domain-transform manifold learning" Nature 555, 487 (2018).

(56) References Cited

OTHER PUBLICATIONS

Zhu, P., et al., "Complete measurement of spatiotemporally complex multi-spatial-mode ultrashort pulses from multimode optical fibers using delay-scanned wavelength-multiplexed holography" Optics Express 25, (2017) pp. 24015-24032.
Zhu, et al., "Space- and intensity-constrained reconstruction for compressed ultrafast photography," Optica 3(7) 694-697 (2016).
Zipunnikov, V. et al., "Functional principal component model for high-dimensional brain imaging," NeuroImage 58, 772-784 (2011).
U.S. Appl. No. 17/030,056, filed Sep. 23, 2020, Wang et al.
Jing, J., et al., "Spatio-temporal-spectral imaging of non-repeatable dissipative soliton dynamics," Nature Communications 11(1) Apr. 28, 2020, pp. 1-9.
Notice of Allowance dated Dec. 15, 2020 issued in U.S. Appl. No. 16/810,630.
Wang, P., et al., "Single-shot ultrafast imaging attaining 70 trillion frames per second," Nature Communications 11(1) Apr. 29, 2020, pp. 1-9.

COMPRESSED-SENSING ULTRAFAST SPECTRAL PHOTOGRAPHY SYSTEMS AND METHODS

CROSS-REFERENCES TO RELATED APPLICATIONS

This application claims priority to and benefit of U.S. Provisional Patent Application No. 62/904,442, titled "Compressed-Sensing Ultrafast Spectral Photography (CUSP)" and filed on Sep. 23, 2029, which is hereby incorporated by reference in its entirety and for all purposes.

FEDERALLY SPONSORED RESEARCH OR DEVELOPMENT

This invention was made with government support under Grant No(s). EB016986 & CA186567 awarded by the National Institutes of Health. The government has certain rights in the invention.

FIELD

Certain embodiments generally relate to ultrafast imaging and, more specifically, certain aspects pertain to compressed-sensing ultrafast spectral photography.

BACKGROUND

Observing extremely fast dynamics requires imaging speeds orders of magnitude beyond the maximum reachable by electronic sensors. The popular stroboscopic method fails to record events in real time since it depends on repeated measurements. This limitation is resolved by single-shot ultrafast imaging techniques. However, none of the single-shot ultrafast imaging techniques have imaging speeds greater than $10^{13}$ frames per second (fps), and most single-shot ultrafast imaging techniques have shallow sequence depths (tens of frames).

SUMMARY

Certain aspects pertain to compressed-sensing ultrafast spectral photography (CUSP) methods and/or systems that can be used, for example, to image ultrafast phenomena.

Certain aspects pertain to a compressed-sensing ultrafast spectral photography (CUSP) system for obtaining a series of final recorded images of a subject. In one implementation, the CUSP system includes an illumination section that includes first and second beam splitters configured to receive a first laser pulse and configured to convert the first laser pulse into a pulse train that comprises a plurality of sub-pulses evenly separated in time and an optical component configured to temporally stretch and chirp each of the sub-pulses of the pulse train, where the illumination section is configured to illuminate an object of interest with the temporally stretched and chirped sub-pulses of the pulse train to produce a first series of images. In one implementation, the CUSP system also includes an imaging section that includes a spatial encoding module configured to receive the first series of images and to produce a second series of spatially encoded images, each spatially encoded image of the second series comprising at least a first view including one image of the first series superimposed with a pseudo-random binary spatial pattern and a streak camera coupled to the spatial encoding module, the streak camera configured to receive the second series of spatially encoded images, to deflect each spatially encoded image by a temporal deflection distance that varies as a function of time-of-arrival, and to integrate the temporally-deflected images into a single raw CUSP image.

Certain aspects pertain to a compressed-sensing ultrafast spectral photography (CUSP) system for obtaining a series of final recorded images of a subject. In one implementation, the CUSP system includes a spatial encoding module configured to receive a first series of images and to produce a second series of spatially-encoded images, each spatially encoded image of the second series comprising at least a first view including one image of the first series superimposed with a pseudo-random binary spatial pattern; an optical element configured to receive the second series of spatially encoded images and to produce a third series of spatially-encoded and spectrally-dispersed images; and a streak camera configured to receive the third series of spatially-encoded and spectrally-dispersed images, to deflect each spatially-encoded and spectrally-dispersed image by a temporal deflection distance that varies as a function of time-of-arrival, and to integrate the temporally-deflected images into a single raw CUSP image.

Certain aspects pertain to a method of obtaining a series of final recorded images of an object using a compressed-sensing ultrafast spectral photography (CUSP) system. In one implementation, the method includes collecting a first series of images of the object; superimposing a pseudo-random binary spatial pattern onto each image of the first series to produce a second series of spatially-encoded images; dispersing each image of the second series of spatially-encoded images by spectrum to produce a third series of spatially-encoded and spectrally-dispersed images; deflecting each spatially-encoded and spectrally-dispersed image of the third series by a temporal deflection distance that varies as a function of a time-of-arrival of each spatially encoded image to produce a fourth series of time-sheared spatially-encoded spectrally-dispersed images; integrating and recording the fourth series of time-sheared spatially-encoded spectrally-dispersed images as a single raw CUSP image; and reconstructing a fifth series of final images by processing the single raw CUSP image according to an image reconstruction algorithm.

These and other features are described in more detail below with reference to the associated drawings.

Figure 1:
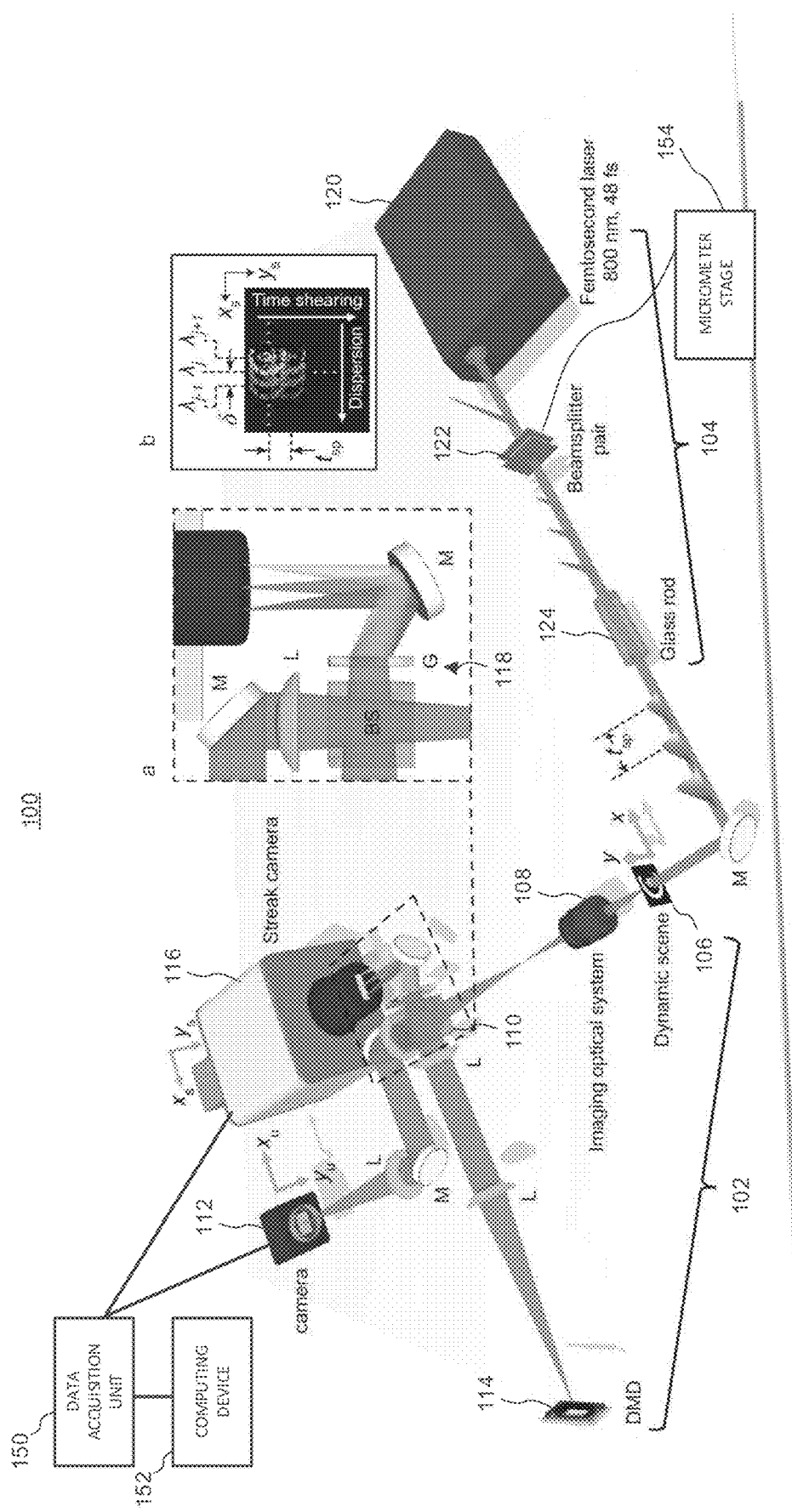
FIG. 1 is a schematic diagram of components of a compressed-sensing ultrafast spectral photography (CUSP) system, according to certain implementations.

These and other features are described in more detail below with reference to the associated drawings.

DETAILED DESCRIPTION

Different aspects are described below with reference to the accompanying drawings. The features illustrated in the drawings may not be to scale. In the following description, numerous specific details are set forth in order to provide a thorough understanding of the presented embodiments. The disclosed embodiments may be practiced without one or more of these specific details. In other instances, well-known operations have not been described in detail to avoid unnecessarily obscuring the disclosed embodiments. While the disclosed embodiments will be described in conjunction with the specific embodiments, it will be understood that it is not intended to limit the disclosed embodiments. Certain aspects pertain to compressed-sensing ultrafast spectral photography (CUSP) methods and/or systems.

I. Introduction

Cameras' imaging speeds fundamentally limit humans' capability in discerning the physical world. Countless femtosecond dynamics, such as ultrashort light propagation, radiative decay of molecules, soliton formation, shock wave propagation, nuclear fusion, photon transport in diffusive media, and morphologic transients in condensed matters, play pivotal roles in modern physics, chemistry, biology, materials science, and engineering. However, real-time imaging—defined as multi-dimensional observation at the same time as the event actually occurs without event repetition—requires extreme speeds that are orders of magnitude beyond the current limits of electronic sensors. Existing femtosecond imaging modalities either require event repetition for stroboscopic recording (termed the "pump-probe" method) or provide single-shot acquisition with no more than $1\times10^{13}$ frames per second (fps) and 300 frames.

One promising approach to ultrafast imaging is compressed ultrafast photography (CUP), which creatively combines a streak camera with compressed sensing. Examples of compressed ultrafast photography methods, which are hereby incorporated by reference in their entireties, are described by Gao, L. et al., "Single-shot compressed ultrafast photography at one hundred billion frames per second." *Nature* 516, 74-77 (2014) and Liang, J. et al., "Single-shot real-time femtosecond imaging of temporal focusing." *Light Sci. Appl.* 7, 42 (2018). A streak camera is a one-dimensional (1D) ultrafast imaging device that first converts photons to photoelectrons, then temporally shears the electrons by a fast sweeping voltage, and finally converts electrons back to photons before they are recorded by an internal camera. In CUP, imaging two-dimensional (2D) transient events is enabled by a scheme of 2D spatial encoding and temporal compression. Unfortunately, CUP's frame rate is limited by the streak camera's capability in deflecting electrons, and its sequence depth (300 frames) is tightly constrained by the number of sensor pixels in the shearing direction.

The compressed ultrafast spectral photography (CUSP) systems and methods described herein can overcome the limits of CUP and other ultrafast imaging systems. As an example, CUSP systems and methods can simultaneously achieve $7\times10^{13}$ fps and 1,000 frames (i.e., sequence depth). CUSP breaks the limitations in framerate of other ultrafast imaging modalities by employing spectral dispersion in the direction orthogonal to temporal shearing, thereby extending to spectro-temporal compression. Furthermore, CUSP can achieve a greater sequence depth by exploiting pulse splitting. The CUSP systems and methods may achieve such results by synergizing spectral encoding, pulse splitting, temporal shearing, and compressed sensing. CUSP is also advantageous in scalability and photon throughput, compared with existing ultrafast imaging technologies. In some configurations, CUSP can function as the fastest single-shot 4D spectral imager (i.e., the fastest single-shot imager that collects (x, y, t, λ) information). As an example, in a passive mode, the CUSP systems and methods may be used achieve four-dimensional (4D) spectral imaging at $0.5\times10^{12}$ fps, enabling single-shot spectrally-resolved fluorescence lifetime imaging microscopy (SR-FLIM).

CUSP's real-time imaging speed of 70 Tfps (70 trillion frames per second) in active mode is three orders of magnitude greater than the physical limit of semiconductor sensors. Owing to this new speed, CUSP can quantify physical phenomena that are inaccessible using the previous record-holding systems. Moreover, active CUSP captures data more than $10^5$ times faster than the pump-probe approach. When switching CUSP to passive mode for single-shot SR-FLIM, the total exposure time for one acquisition (<1 ns) is more than $10^7$ times shorter than that of time-correlated single photon counting (TCSPC). As a generic hybrid imaging tool, CUSP's scope of application far exceeds the demonstrations presented herein. The imaging speed and sequence depth can be highly scalable via parameter tuning. CUSP can cover its spectral region from X-ray to NIR, and even matter waves such as electron beams, given the availability of sources and sensing devices.

Both the pump-probe and TCSPC methods require event repetition. Consequently, these techniques are not only slower than CUSP by orders of magnitude as aforementioned, but are also inapplicable in imaging the following classes of phenomena: (1) high-energy radiations that cannot be readily pumped such as annihilation radiation (basis for PET), Cherenkov radiation, and nuclear reaction radiation; (2) self-luminescent phenomena that occur randomly in nature, such as sonoluminescence in snapping shrimps; (3) astronomical events that are light-years away; and (4) chaotic dynamics that cannot be repeated. Yet, CUSP can observe all of these phenomena. For randomly occurring phenomena, the beginning of the signal can be used to trigger CUSP.

II. Compressed Ultrafast Spectral Photography (CUSP)

FIG. 1 is a schematic diagram of components of a compressed ultrafast spectral photography (CUSP) system 100, according to certain implementations. In some aspects, CUSP includes two components, an imaging section 102 and an optional illumination 104 section. CUSP can be configured for operation in an active imaging mode and passive imaging mode. The imaging section is utilized in both the active and passive imaging modes, while the illumination section is utilized for the active imaging mode only.

A. Imaging Section

CUSP system 100 includes an imaging section 102. In the imaging section 102, a dynamic scene 106 (I(x, y, t, λ)) is imaged by an lens system 108. Light from the lens system 108 is then received by beam splitter (BS) 110 and split into two portions. Beam splitter 110 may spilt the incoming light between the two portions evenly, or unevenly with more light intensity directed toward one portion than the other portion, as desired. It should be understood that CUSP system 100 may include various optical elements such as mirrors M and lenses L, that the depictions of such optical elements in the figures is merely an example of one possible configuration, and that number and placement of such optical elements can be varied without changing the principles of operation of CUSP system 100.

The first portion of light from the beam splitter 110 may be routed through an optical system (e.g., one or more mirrors M, lenses L, and/or other optical elements) toward camera 112, which is configured to capture a time-unsheared spectrum-undispersed image (defined as u-View). Camera 112 may be, as an example, a CMOS camera. In the example imaging configurations described herein, camera 112 was implemented using a Point Grey camera model GS3-U3-28S4M. Other cameras, including non-CMOS cameras, may be utilized in place of camera 112, as desired. Data acquisition unit 150 may acquire the time-unsheared spectrum-undispersed image (u-View) from camera 112.

The second portion of light from the beam splitter 110 may be routed toward a digital micromirror device (DMD) 114. In some configurations, DMD 114 is a DLP® Light-Crafter 3000® from Texas Instruments. DMD 114 may, in some embodiments, include a plurality of micromirrors, each of which can switch between first and second states. When a micromirror is in the first state, light from the beam splitter 110 that reflects off of that micromirror may be reflected onto an optical path towards streak camera 116. When a micromirror is in the second state, light from the beam splitter 110 that reflects off of that micromirror may be reflected onto another optical path. In some configurations, light that reflects off a micromirror in the second state is discarded. In some other configurations, a second streak camera may be provided and light that reflects off a micromirror in the second state may be reflected onto an optical path towards the second streak camera. Use of a second streak camera in this manner may improve spatial resolution and/or temporal resolution of the CUSP system 100 in certain situations.

In some embodiments, DMD 114 may be loaded with a pseudo-random pattern (e.g., each micromirror of DMD 114 may be placed into the first or second state in a pseudo-random manner). As a result, the light routed toward DMD 114 may be encoded according the pseudo-random binary pattern loaded into the DMD 114. In some configurations, a static pseudo-random binary pattern with a non-zero filling ratio of 35% is displayed on the DMD 114. In other embodiments, DMD 114 may be loaded with a non-random pattern. If desired, individual micromirrors within DMD 114 may be binned together (trading resolution for increased signal). In some configurations, DMD 114 may be configured with 3×3 binning (e.g., DMD 114 is divided into groups of 3×3 micromirrors, where the micromirrors in each group are set to a common state). The encoded light may then be relayed to a fully-opened (or partially-opened) entrance port of the streak camera 116.

Before reaching the streak camera 116, the encoded light from DMD 114 may pass through a diffraction grating such as diffraction grating 118 (also labeled G in insert a of FIG. 1). The diffraction grating 118 may spectrally disperse the encoded light in a horizontal direction (e.g., such that the encoded light is dispersed along axis $x_s$, when reaching the entrance slit of streak camera 116). In some configurations, the diffraction grating 118 may spectrally disperse the encoded light in a direction that is orthogonal to the direction of shearing that occurs in streak camera 116. In the configuration of FIG. 1, higher frequencies of light are dispersed towards the bottom of FIG. 1 (i.e., in the direction "away" from streak camera 116 in the insert a of FIG. 1), while lower frequencies of light are dispersed towards the top of FIG. 1 (i.e., in the direction "towards" streak camera 116 in the insert a of FIG. 1). After the light is reflected off of optional mirror M, the higher frequencies of light enter into the left side of the entrance slit of streak camera 116, while lower frequencies of light enter into the right side of the entrance slit of streak camera 116 (in the perspective of the insert a of FIG. 1).

During imaging, the streak camera 116 may have a partially or fully opened slit to capture 2D images. The streak camera 116 converts the arriving photons to electrons at the photocathode, applies time-dependent shearing to these electrons using a sweeping voltage, converts the electrons back to photons using a phosphor screen, amplifies the photos via an image intensifier, and then integrates the time-sheared image on an image sensor. Streak camera 116 may also be referred to as a temporal encoding modulator. Within the streak camera 116, the electrons may be temporally sheared in a direction orthogonal to the spectral dispersion imparted by diffraction grating 118. As an example, the electrons may be sheared in a vertical direction (e.g., along axis $y_s$, a direction into and out of the plane of insert a of FIG. 1). Streak camera 116 may receive the entire, or less than the entire, field of view of the spectrally-dispersed and spatially-encoded image from diffraction grating 118 and DMD 114, deflect the spectrally-dispersed and spatially-encoded image by a temporal deflection distance proportional to time-of-arrival, and record the deflected image as a time-sheared spectrally-dispersed spatially-encoded image (defined as s-View). The image captured by the internal camera within streak camera 116 is time-sheared by streak camera 116, spectrally-dispersed by diffraction grating 118, and spatially-encoded by DMD 114. An example of such a time-sheared spectrally-dispersed spatially-encoded image (e.g., an s-View) is shown in insert b of FIG. 1. The image sensor in the streak camera 116 may be a CMOS camera such as the Orca R2 from Hamamatsu, as an example. Data acquisition unit 150 may acquire the time-sheared spectrally-dispersed spatially-encoded image (s-View) from streak camera 116 (e.g., the internal camera of streak camera 116).

B. Illumination Section

When operating in active mode, an illumination section 104 may encode time into spectrum, as shown in FIG. 1. In particular, a broadband femtosecond pulse (e.g., a 48-fs, 800 nm wavelength pulse) may be generated by laser 120. The broadband pulse may be converted to a pulse train with neighboring sub-pulses separated by time $t_{sp}$, using a pair of high-reflectivity beam splitters 122. Beam splitters 122 may be passive optical components. Other examples of passive optical components include mirrors, lenses, beam splitters, diffraction gratings, glass rod 124, and the like. An example of an active optical component includes DMD 114.

Figure 7:
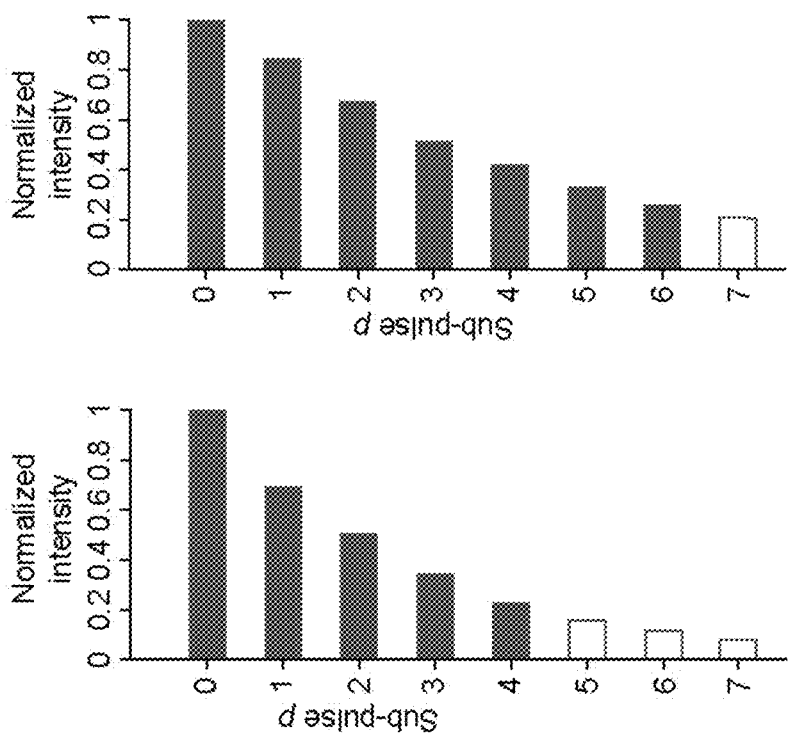
FIG. 7 illustrates a pulse train generator that that may be used in a CUSP system, according to an aspect.
Figure 7:
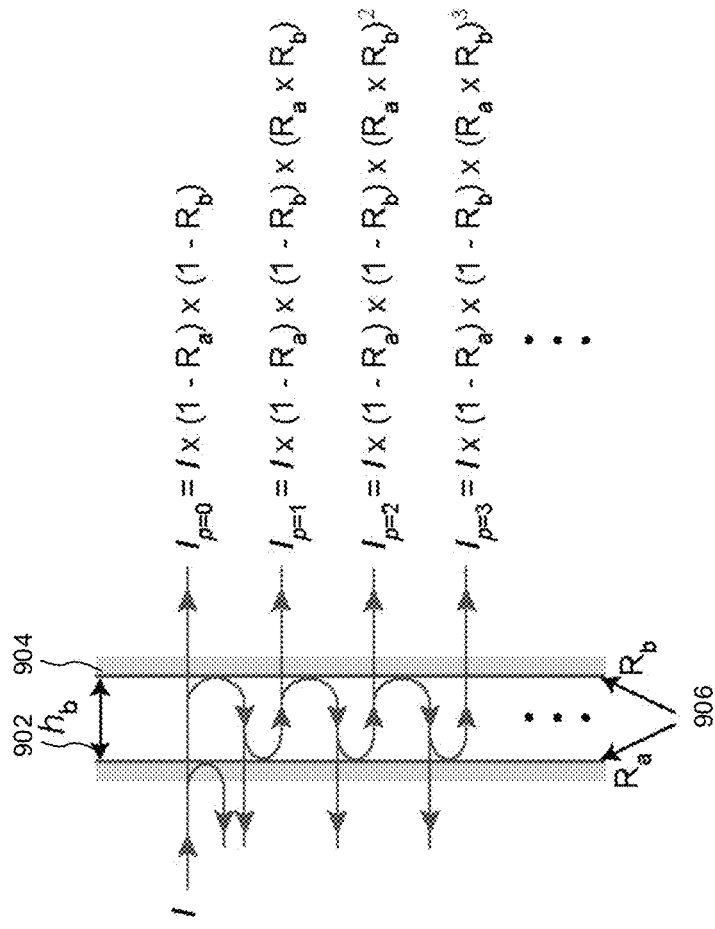

A schematic of a pair of beam splitters 902 and 904 in proximity, which may serve as beam splitters 122 of FIG. 1, is shown in FIG. 7. Beam splitters 902 and 904 may operate in a non-resonance mode. The time delay between neighboring sub-pulses may be determined by the physical gap $h_b$:

$$t_{sp} = \frac{2h_b}{c} n_0. \qquad (1)$$

In equation (1), $n_0=1$ (for air) and c is the speed of light. A high-precision micrometer stage (shown schematically at stage 154 in FIG. 1) may be used to control the position of one beam splitter relative to the other. Stage 154 may have a step size of 300 nm (equivalent to approximately 2 fs in time delay). In some other configurations, stage 154 may have step size of less than 150 nm, less than 150 nm, less than 450 nm, less than 600 nm, less than 750 nm, less than 900 nm, or greater than 900 nm or may have a step size in the range of 150 nm to 300 nm, in the range of 300 nm to 450 nm, in the range of 450 nm to 600 nm, in the range of 600 nm to 750 nm, or in the range of 750 nm to 900 nm. Note that the sides of the beam splitters 902 and 904 coated with beam splitter coating 906 face the cavity (gap between the beam splitters) so that all the sub-pulses go through the beam splitter substrates the same number of times, which is also the minimum number of times. To protect the laser cavity from unwanted back-reflection, the beam splitters may be slightly tilted. In the examples presented here, $t_{sp}=2$ ps and $2h_b=600$ μm, which is far below the measured coherence length of 20 μm. Thus, there is effectively no interference between neighboring sub-pulses.

The intensity of each sub-pulse was experimentally measured by the streak camera 116 at 10 THz sweeping speed. Beam splitters of higher reflectivity may generate more usable sub-pulses, but with a penalty of reduced pulse energy. Charts b and c of FIG. 7 show the results of generating five and seven usable sub-pulses, respectively. Due to the response linearity of the streak camera (as shown in graph c of FIG. 6), the normalized pixel value equals the normalized light intensity. As the sub-pulse order p increases, its intensity falls exponentially. Therefore, only the first few sub-pulses are used, while the rest may be discarded due to the lower intensity, which could lead to a lower SNR.

After conversion of the broadband pulse to a pulse train by beam splitters 122, the pulse train may be temporally stretched and chirp each sub-pulse. As an example, the pulse train may be passed through a homogenous glass rod 124. Since the chirp imparted by glass rod 124 is linear, each wavelength in the pulse bandwidth carries a specific time fingerprint. Thereby, this pulse train is sequentially timed by $t(p, \lambda)=pt_{sp}+\eta(\lambda-\lambda_0)$, where $p=0, 1, 2, \ldots, (P-1)$ represents the sub-pulse sequence, $\eta$ is the overall chirp parameter, and $\lambda_0$ is the minimum wavelength in the pulse bandwidth.

This timed pulse train then illuminates a dynamic scene 106 ($I(x,y,t)=I(x, y, t(p, \lambda))$), which is subsequently imaged by the imaging section 102.

In the examples presented here, glass rods 124 of various lengths, made of N-SF11, were employed to linearly chirp and stretch the femtosecond pulse to a picosecond length. N-SF11 has a group velocity dispersion (GVD) of 187.5 fs²/mm at $\lambda_c=800$ nm, which is translated to a GVD parameter of $D_\lambda=-0.555$ fs/(nm/mm) by $$D_\lambda = -\frac{2\pi c}{\lambda_c^2} \cdot GVD. \qquad (2)$$

For a bandwidth of 38 nm, a 270-mm-long N-SF11 rod and a 95-mm-long one stretch the 48-fs pulse to 5.7 ps and 2.0 ps, corresponding to negative chirp parameters of $\eta_{rod\_1}=-150$ fs/nm and $\eta_{rod\_2}=-52.7$ fs/nm, respectively. The 270-mm rod and the 95-mm rod were deployed for the experiments shown in FIGS. 2 and 3, respectively.

For a bandwidth of 38 nm, a 270-mm-long N-SF11 rod and a 95-mm-long one stretch the 48-fs pulse to 5.7 ps and 2.0 ps, corresponding to negative chirp parameters of $\eta_{rod\_1}=-150$ fs/nm and $\eta_{rod\_2}=-52.7$ fs/nm, respectively. The 270-mm rod and the 95-mm rod were deployed for the experiments shown in FIGS. 2 and 3, respectively.

Figure 8:
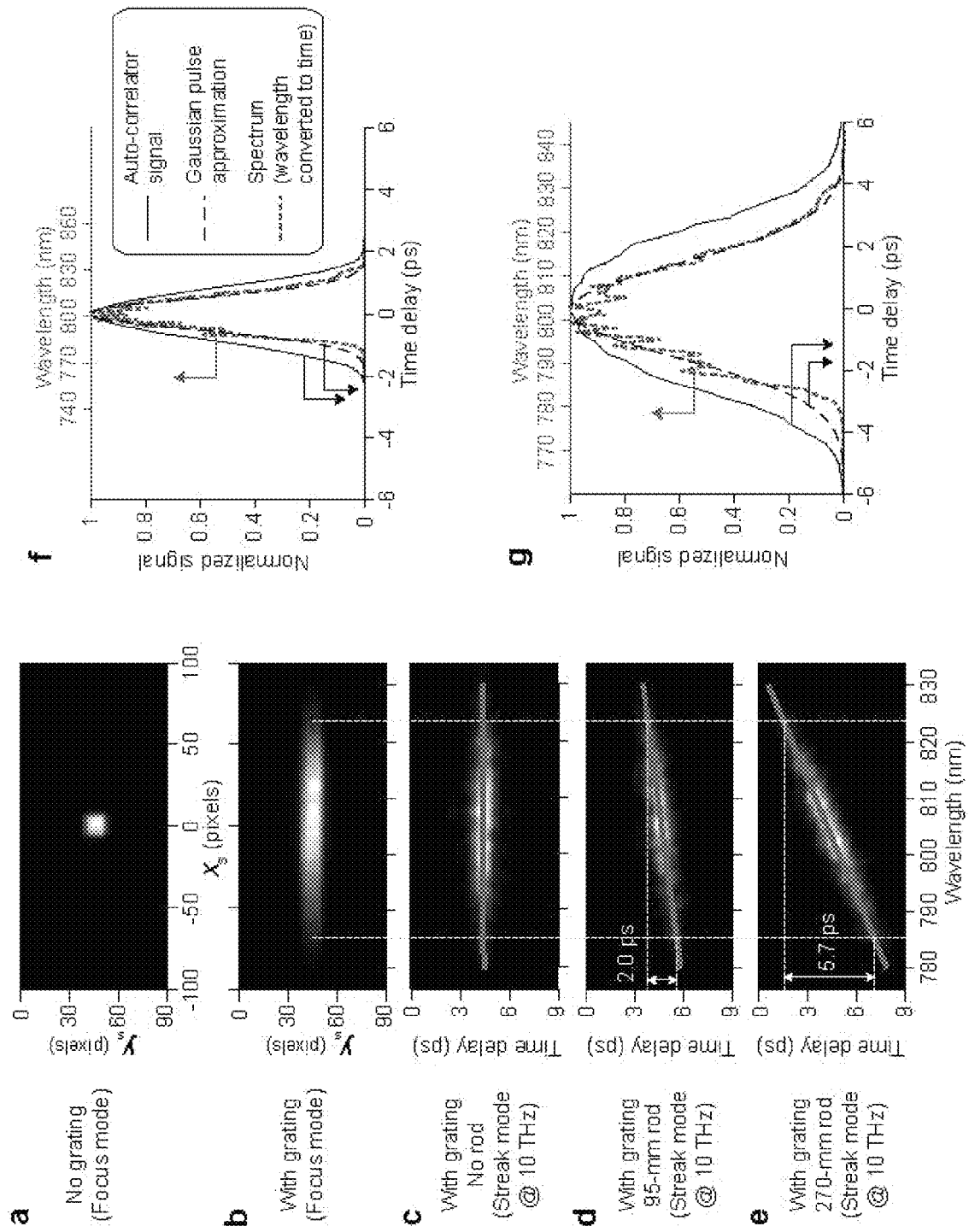
FIG. 8 illustrates data captured by a CUSP system, according to an aspect.
Figure 9:
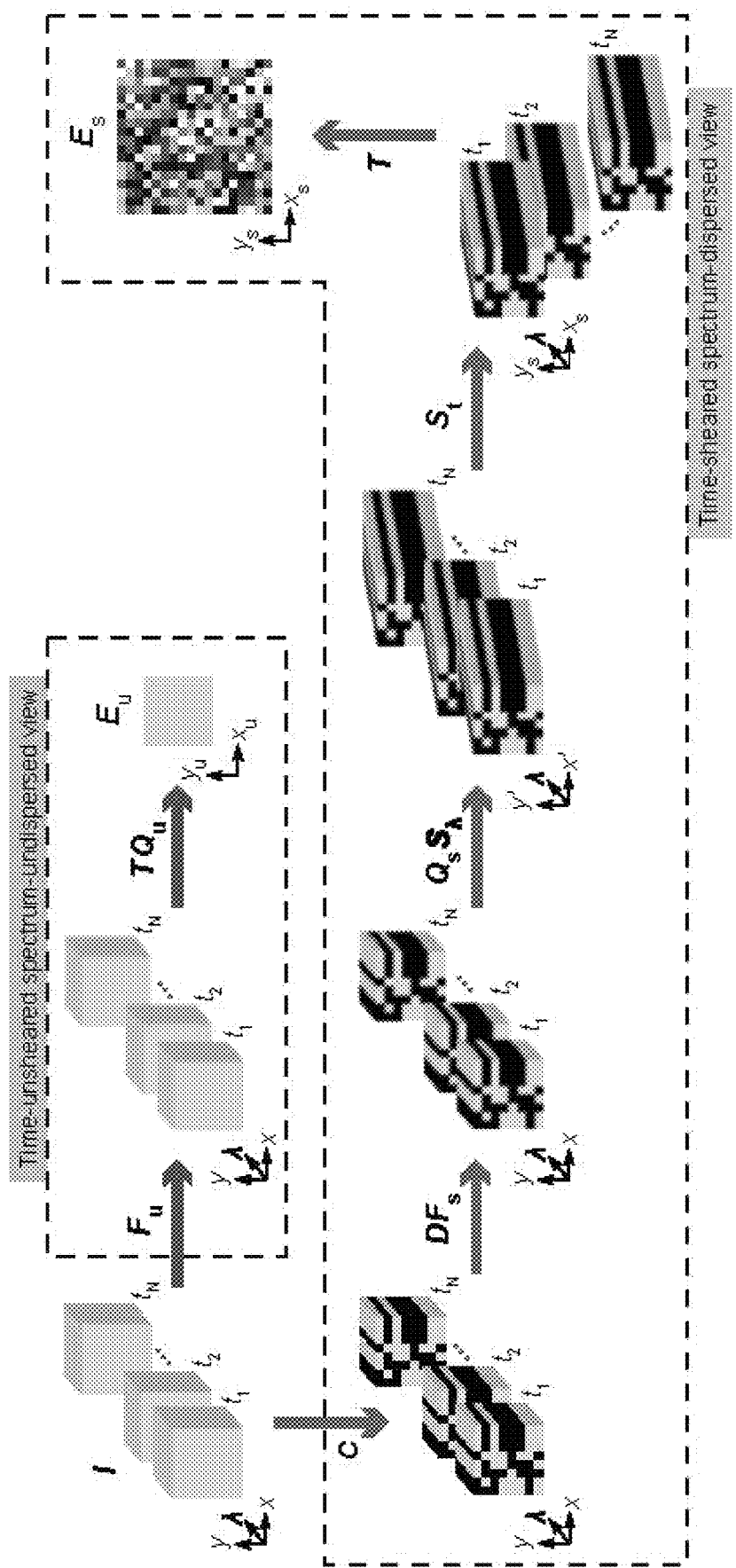
FIG. 9 illustrates a data acquisition process of a CUSP system, according to an aspect.

Measurements of the pulse train, before and after being stretched, were obtained and are shown in FIG. 8. Image a of FIG. 8 was acquired by streak camera 116 without diffraction grating 118, while image b was acquired with diffraction grating. Images c, d, and e of FIG. 8 were acquired with diffraction grating 118 and the streak camera 116 operating in 10-THz streak mode. Images c, d, and e of FIG. 8 were acquired with no glass rod 124, with a 95-mm glass rod 124, and with a 270-mm glass rod 124, respectively.

As shown in image a of FIG. 8, grating 118 disperses a square-shaped object in the horizontal direction. When there is no rod 124, the time-sheared image acquired in streak mode resembles that acquired in focus mode. However, a large temporal chirp becomes evident when a stretching rod is inserted. The measured time delay between the shortest (785 nm) and the longest (823 nm) wavelengths matched well with the theoretical predictions. The temporal chirp by a homogeneous isotropic rod can be treated as a linear chirp. This linearity is demonstrated by the centers of the light intensity distributions at different wavelengths, which match well with the theoretical estimation based on a linear temporal chirp (solid lines overlaid in the in images c, d, and e of FIG. 8). In graphs f and g of FIG. 8, measurements from an auto-correlator and spectrometer also confirm the stretch. After converting the wavelength to time through the linear chirp parameter, the spectrum (short-dashed line) yields an intensity profile well matching the Gaussian-pulse approximation (long-dashed line) derived from the auto-correlator signals.

When operating in active mode, the imaging framerate of CUSP system 100 is determined by $R_a=\|\mu\|/(|\eta|d)$, where $\mu$ is the spectral dispersion parameter of the system, and d is the streak camera's pixel size. The sequence depth is $N_{ta}=PB_i|\mu|/d$, where P is the number of sub-pulses, and $B_i$ is the used spectral bandwidth of the illuminating light pulse (785 nm to 823 nm).

C. Image Reconstruction

Computing device 152 may be configured with a CUSP reconstruction algorithm, may receive the time-unsheared spectrum-undispersed image (u-View) from camera 112, may receive the time-sheared spectrally-dispersed spatially-encoded image (s-View) from streak camera 116, and may use these images in reconstructing individual image frames. As part of reconstructing the sequence images, computing device 152 may also utilize the pattern loaded into DMD 114. In some configurations, computing device 152 may be coupled to DMD 114, configured to load patterns into DMD 114, and/or configured to receive a pattern loaded into DMD 114 from DMD 114 or another device. Reconstructing the sequence images with a CUSP reconstruction algorithm may be an under-sampled inverse problem.

As previously noted, camera 112 captures u-View (a time-unsheared spectrum-undispersed image) and streak camera 116 captures s-View (a time-sheared spectrally-dispersed spatially-encoded image). The measured optical energy distributions in these two views are denoted as $E_u$ and $E_s$, respectively. Mathematically, they can be linked to the intensity distribution of the dynamic scene I(x, y, t, λ) by $$\begin{bmatrix} E_u(x_u, y_u) \\ E_s(x_s, y_s) \end{bmatrix} = \begin{bmatrix} TQ_u F_u \\ \alpha TS_t Q_s S_\lambda DF_s C \end{bmatrix} I(x, y, t, \lambda), \quad (3)$$

where C represents the spatial encoding by the DMD; $F_u$ and $F_s$ represent the spatial low-pass filtering due to the optics of CUSP imaging system 100 in u-View and s-View, respectively; D represents image distortion in s-View with respect to the u-View; $S_\lambda$ represents the spectral dispersion in the horizontal direction due to diffraction grating 118; $Q_u$ and $Q_s$ denote the quantum efficiencies of the camera 112 and the photocathode of the streak camera 116, respectively; $S_t$ represents the temporal shearing in the vertical direction within streak camera 116; T represents spatiotemporal-spectrotemporal integration over the exposure time of the camera 112 and the streak camera; and a denotes the experimentally calibrated energy ratio between the streak camera 116 and camera 112. The dynamic scenes observed by both active CUSP and passive CUSP are generalized herein as I(x, y, t, λ) for simplicity. Equation (3) can be modified to the following concatenated form E=OI(x, y, t, λ), where E=[$E_u$,α$E_s$] and O stands for the joint operator.

Given the operator O and the spatiotemporal-spectrotemporal sparsity of the dynamic scene, I(x, y, t, λ) can be recovered by solving the following inverse problem:

$$\hat{I} = \operatorname{argmin}_I \left\{ \frac{1}{2} \|E - OI\|_2^2 + \beta \Phi(I) \right\}. \quad (4)$$

In Equation (4), $\|\cdot\|_2$ denotes the $l_2$ norm. The first term denotes the discrepancy between the solution I and the measurement E via the operator O. The second term enforces sparsity in the domain defined by the following regularizer Φ(I) while the regularization parameter β balances these two terms. In some configuration, total variation (TV) is used in the four-dimensional x-y-t-λ, space as a regularizer. To accurately and stably reconstruct the dynamic scene, E is sent into a software program adapted from the two-step iterative shrinkage/thresholding (TwIST) algorithm.

Figure 2:
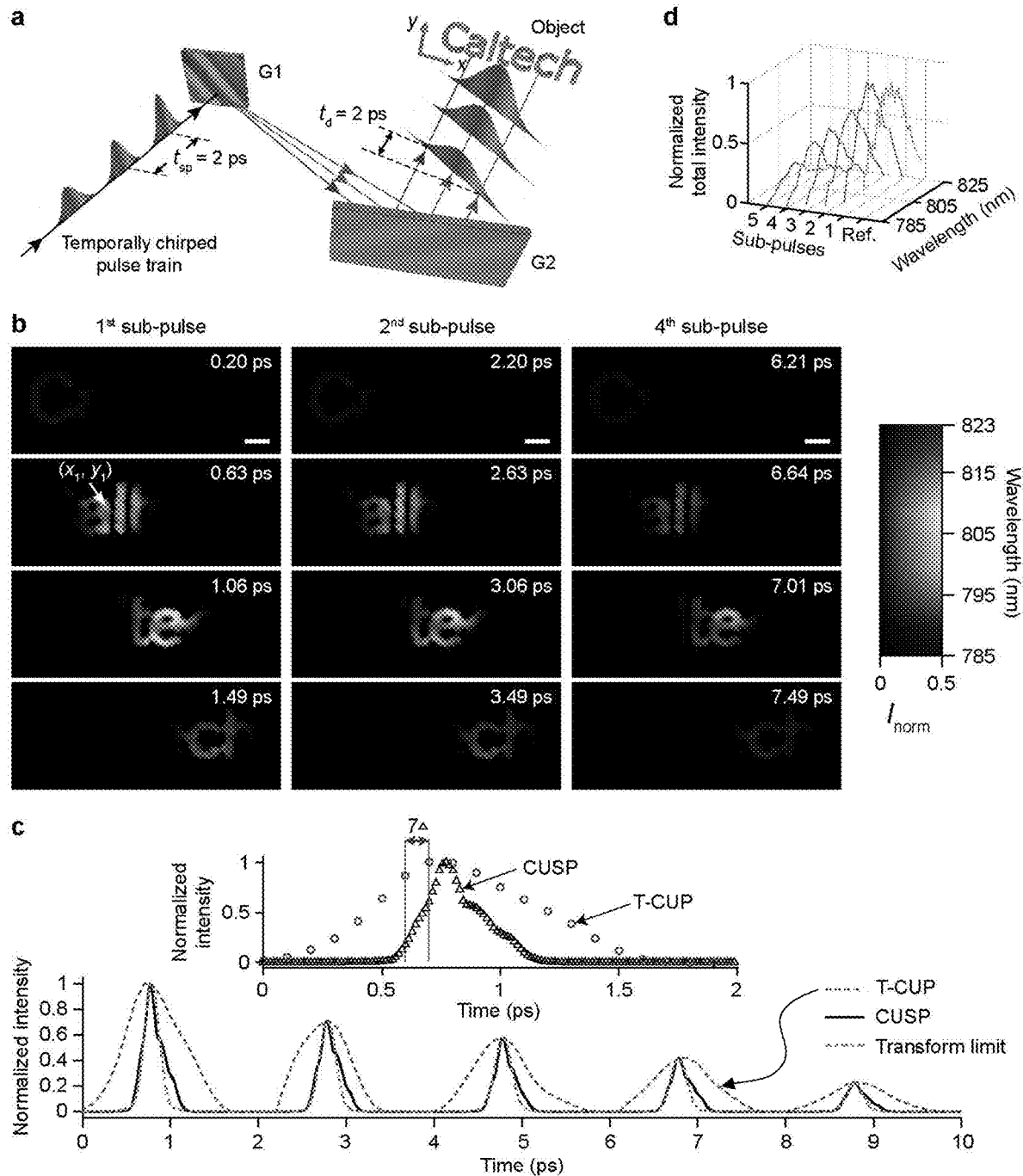
FIG. 2 illustrates a CUSP system imaging an ultrafast linear optical phenomenon, according to an aspect.
Figure 3:
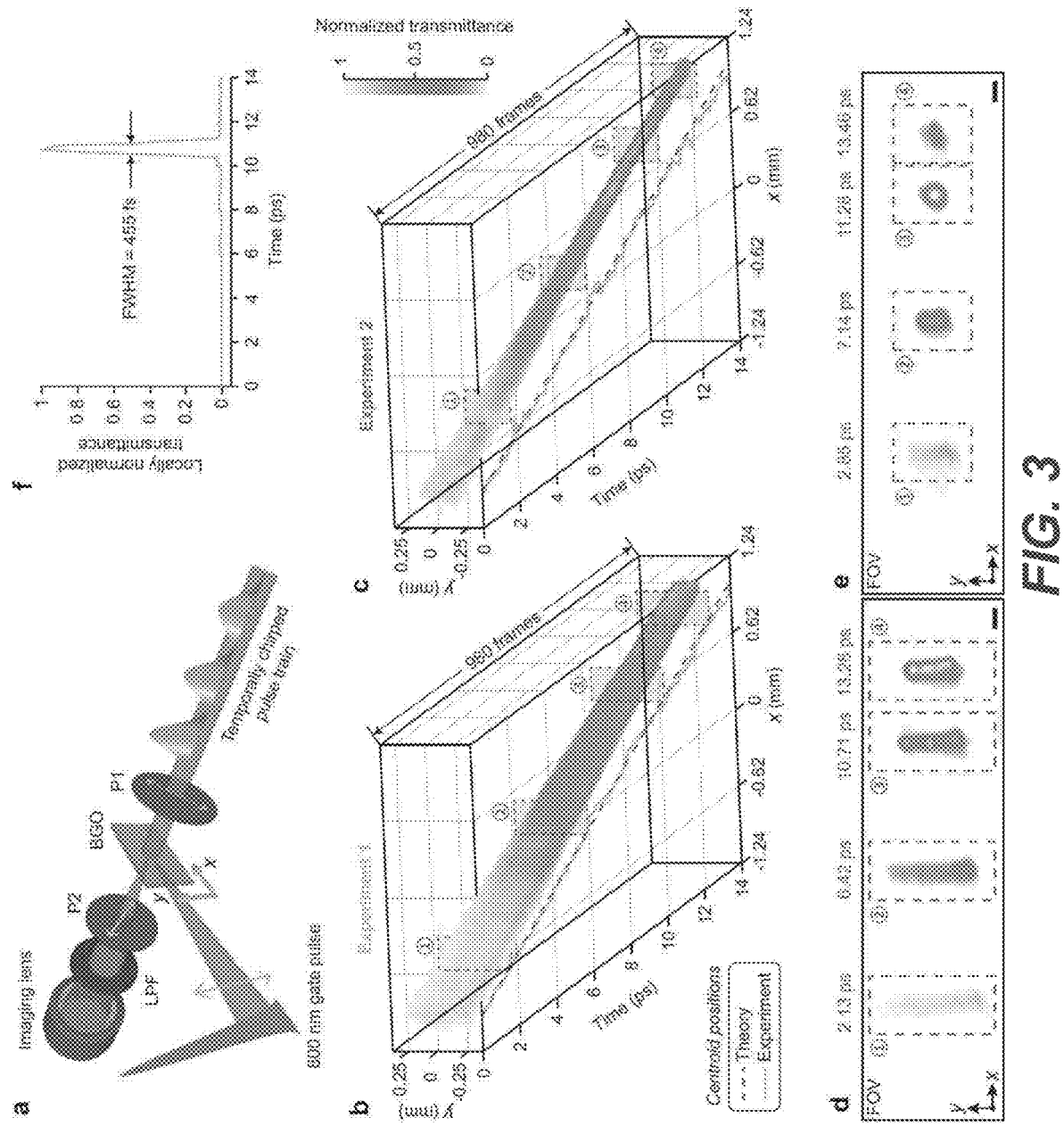
FIG. 3 illustrates a CUSP system imaging an ultrafast nonlinear optical phenomenon, according to an aspect.
Figure 4:
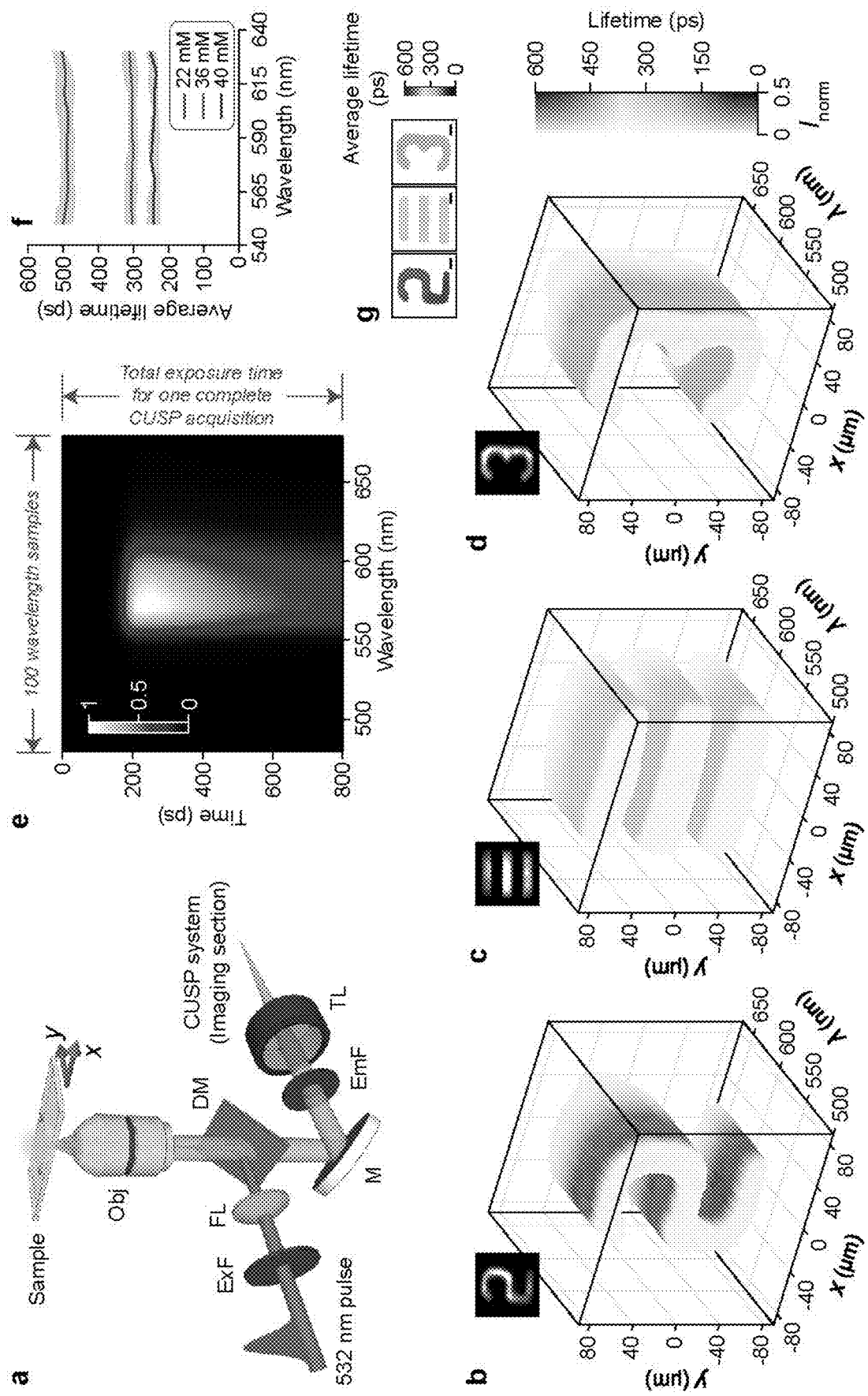
FIG. 4 illustrates a CUSP system imaging an ultrafast fluorescence phenomenon, according to an aspect.

In the TwIST algorithm, the regularization parameter β was assigned values of 0.6, 0.5 and 1.0 for the three sets of experiments shown in FIGS. 2, 3, and 4, respectively. Additionally, the maximum number of iterations was set to 50. These are merely examples and other values may also be suitable. The total variation defined by equation (5) was selected as the regularizer, $$\Phi(I) = \Phi_{TV}(I) = \quad (5)$$

$$\sum_k \sum_q \sum_{m,n} \sqrt{(I[m, n+1, k, q] - I[m, n, k, q])^2 + (I[m+1, n, k, q] - I[m, n, k, q])^2} +$$

$$\sum_m \sum_n \sum_{k,q} \sqrt{(I[m, n, k+1, q] - I[m, n, k, q])^2 + (I[m, n, k, q+1] - I[m, n, k, q])^2}.$$

To implement the CUSP reconstruction, accurate estimations and/or measurements may be needed for the spatial low-pass filtering operators $F_u$ and $F_s$, the encoding matrix C[m, n], the distortion matrix D, and the adjoint of operator O. Discussion of how to estimate and/or measure the distortion matrix D is presented in U.S. Provisional Patent Application No. 62/904,442, titled "Compressed-Sensing Ultrafast Spectral Photography (CUSP)" and filed on Sep. 23, 2019, which has been and is again hereby incorporated by reference in its entirety and for all purposes. An example of how to estimate and/or measure the other operators is described by J. Liang, C. Ma, L. Zhu, Y. Chen, L. Gao, and L. V. Wang, "Single-shot real-time video recording of a photonic Mach cone induced by a scattered light pulse," Science Advances 3, e1601814 (2017), which is hereby incorporated by reference in its entirety.

CUSP's reconstruction of a data matrix of dimensions $N_x \times N_y \times N_{ta}$ (active mode) or $N_x \times N_y \times N_{tp} \times N_\lambda$ (passive mode) may require a 2D image of $N_x \times N_y$ in u-View and a 2D image of $N_{col} \times N_{row}$ in s-View. In one example of the active mode, $N_{col} = N_x + (N_{ta}/P) - 1$ and $N_{row} = N_y + (vt_{sp}/d)(P-1)$; in one example of the passive mode, $N_{col} = N_x + N_\lambda - 1$ and $N_{row} = N_y + N_{tp} - 1$. The finite pixel counts of streak camera 116 (e.g., 672×512 after 2×2 binning in one configuration) may physically restrict $N_{col} < 672$ and $N_{row} < 512$. In active CUSP imaging, further described in connection with FIG. 2, a raw streak camera image of 609×430 pixels may be required to reconstruct a data matrix of $N_x \times N_y \times N_{ta} = 470 \times 350 \times 700$. Similarly, in connection with the example of FIG. 3, reconstruction of a data matrix of $N_x \times N_y \times N_{ta} = 330 \times 90 \times 980$ may require an image of 469×210 pixels from the streak camera 116. In the passive-mode imaging example shown in FIG. 4, an SR-FLIM data matrix of $N_x \times N_y \times N_{tp} \times N_\lambda = 110 \times 110 \times 400 \times 100$ may be associated with a streak camera image of 209×509 pixels.

D. Streak Camera

Figure 5:
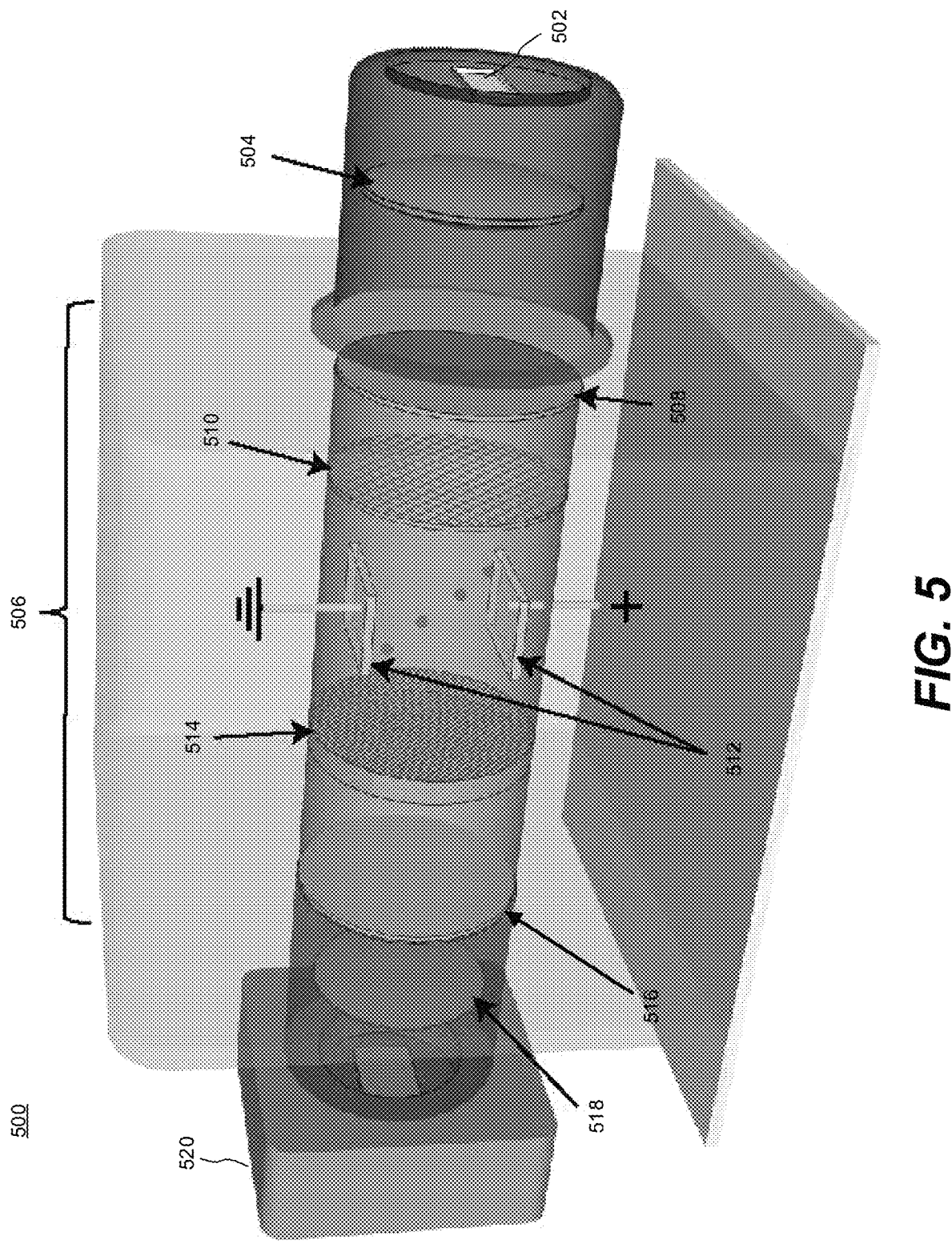
FIG. 5 is a diagram of a streak camera that may be used in a CUSP system, according to an aspect.

FIG. 5 is a diagram of a streak camera such as streak camera 116 that may be utilized in a CUSP imaging system such as imaging system 100 of FIG. 1. As shown in FIG. 4, streak camera 500 may include a fully-opened, or partially-opened slit 502 (to enable 2D imaging), input optics 504, streak tube 506, and an internal camera 520 (e.g., a CCD, CMOS, or other 2D imaging sensor). The streak tube 506 may include photocathode 508, accelerating mesh 510, sweep electrodes 512 (across which a sweeping voltage can be applied), microchannel plate 514 (which amplifies the electron current via generation of secondary electrons), phosphor screen 516, and output optics 518, as examples. When operating in focus mode, no sweeping voltage is applied to sweep electrodes 512. The dots between the sweep electrodes 512 in FIG. 5 represent accelerated electrons having different times of arrival and thus different amounts of deflection by sweep electrodes 512. With the streak camera utilized in the present configurations, the highest sweeping speed is 100 fs per pixel, equivalent to 10 THz.

In at least some configurations, the spectral sensitivity of the streak camera is taken into account in data acquisition and image reconstruction. The measured quantum efficiency $Q_s(\lambda)$ of the photocathode 508—the photon-sensitive element in the streak tube 506—is plotted in graph a of FIG. 6. Note that the output optics 518 and the input optics 504 of the streak camera 500 may, in some configurations, be assumed to have uniform transmission within each band. Since photoelectrons lose their wavelength fingerprints after generation and acceleration, the spectral sensitivity of phosphor screen 516 and internal camera 520 can be excluded.

A space-charge effect can occur when too many photoelectrons, confined at the focus of an electron imaging system, repel each other, limiting both spatial and temporal resolutions of the streak camera 500. The space-charge induced spread in the orthogonal directions was studied at different optical intensities deposited at the entrance. A femtosecond laser with a 1-kHz pulse repetition rate was used as the source. Spread in the vertical direction $y_s$ was equivalent to the spread in the time domain. As shown in graph b of FIG. 6, at low intensity, the space-charge effect is negligible, but it becomes evident and intolerable quickly as the incident intensity increases. In practice, it is critical to control the incident intensity to reduce and/or minimize the space-charge effect (e.g., to be less than 2 pixels). On the other hand, the intensity has to be high enough to provide a desirable signal-to-noise ratio (SNR). Thus, the intensity may need to adjusted to balance between excessive space-charge effect and a sufficiently high signal-to-noise ratio.

Figure 6:
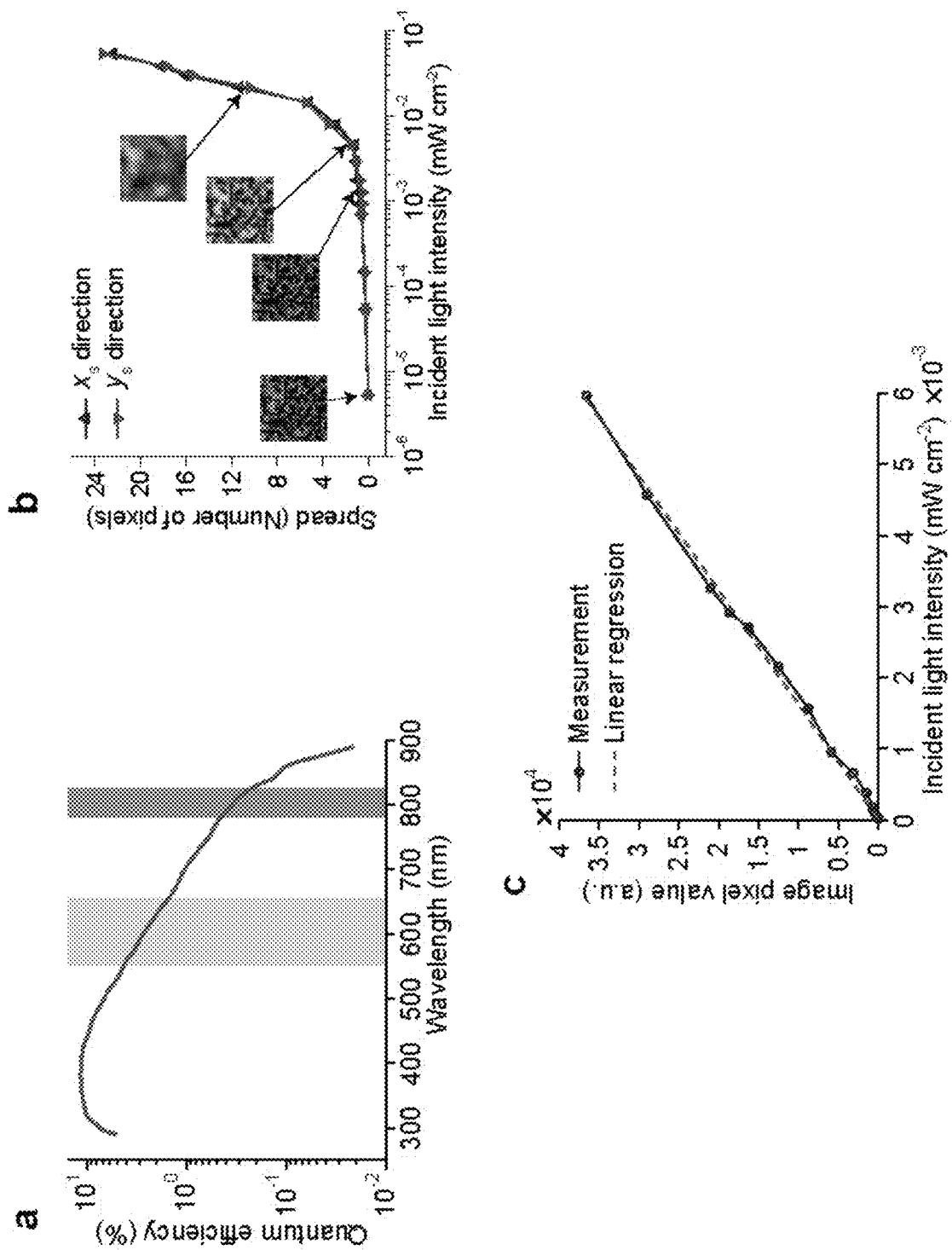
FIG. 6 includes graphs of various properties of a streak camera that may be used in a CUSP system, according to an aspect.

The data acquisition model of CUSP may presume that the streak camera 500 responds linearly to the incident light intensity. Graph c of FIG. 6 plots the measured response curve, which exhibits good linearity (>0.999) between the sensor pixel value and the incident light intensity, at least for light intensities lower than where the space-charge effect becomes evident.

The streak camera used in the present examples had a tested sweeping linearity (i.e. linearity of the ultrafast sweeping voltage applied inside the streak tube better than 0.996, which is sufficient. In addition, at a 10 THz sweeping speed and low light intensity, the streak camera used in the present examples had a tested temporal resolution of 230 fs. However, this value is for 1D ultrafast imaging only. At low light levels (e.g., 1000 photons per pixel in the streak camera's raw image), the SNR may be too poor to produce clear CUSP images in a single shot. At higher light levels (e.g., 20,000 photons per pixel in the streak camera's raw image) that have a moderate SNR, the temporal resolution is typically larger than 400 fs. The temporal resolution of active CUSP is not bounded by these limits.

III. CUSP Active Mode Imaging of an Ultrafast Linear Optical Phenomenon

As shown in FIG. 2, CUSP imaging system 100, configured in active mode (e.g., utilizing the illumination section 104), was used in imaging an ultrafast linear optical phenomenon.

Simultaneous characterization of an ultrashort light pulse spatially, temporally, and spectrally may be useful, as examples, for studies on laser dynamics and multimode fibers. As shown in schematic a of FIG. 2, a spatially and temporally chirped pulse was created by a pair by pair of gratings G1 and G2 (located in the optical path between glass rod 124 and the scene 106). The first grating G1 may impart angular dispersion into the light pulse, while the second grating G2 may remove that angular dispersion such that the light is again collimated, but with a new spatial dispersion. Negative and positive temporal chirps from a 270-mm-long glass rod and the grating pair G1 and G2, respectively, were carefully balanced so that the combined temporal spread $t_d$ was close to the sub-pulse separation $t_{sp}$=2 ps. The pulse train irradiated a sample of printed letters, which is used as the dynamic scene 106 (whose location is illustrated in FIG. 1). Exemplary frames from the CUSP reconstruction are summarized in part b of FIG. 2. These frames show that each sub-pulse swiftly sweeps across the letters from left to right. Due to spatial chirping by the grating pair G1 and G2, the illumination wavelength also changes from short to long over time. In particular, the frames at the start of a given sub-pulse have relatively short wavelengths (near the 785 nm lower range), while frames at the end of a given sub-pulse have relatively long wavelengths (near the 823 nm upper range). The normalized light intensity at a selected spatial point, plotted in graph c of FIG. 2, contains five peaks, representing the five sub-pulses. The peaks have an average full width at half maximum (FWHM) of 240 fs, corresponding to 4.5 nm in the spectrum domain. Fourier transforming the intensity in the spectrum domain to the time domain gives a pulse with a FWHM of 207 fs, indicating that our system operates at the optimal condition bounded by the time-bandwidth limit.

Using a dispersion parametery $\mu$=23.5 µm/nm, a chirp parameter $\eta$=52.6 fs/nm and a pixel size d=6.45 µm, the active mode CUSP system 100 offers a frame rate as high as 70 Tfps. As examples, the active mode CUSP system 100 may have a frame rate greater than 10 Tfps, greater than 20 Tfps, greater than 30 Tfps, greater than 40 Tfps, greater than 50 Tfps, greater than 60 Tfps, or greater than 70 Tfps. Simultaneously with such framerates, the active mode CUSP system 100 may have a sequence depth of at least 100 frames, at least 200 frames, at least 300 frames, at least 400 frames, at least 500 frames, at least 600 frames, at least 700 frames, at least 800 frames, at least 900 frames, or at least 1,000 frames. A control experiment imaged the same scene using a trillion-frame-per-second CUP (T-CUP) technique with 10 Tfps. Its reconstructed intensity evolution at the same point exhibits a temporal spread 3.2× wider than that of CUSP. In addition, within any time window, CUSP achieves an approximately 7× increase in the number of frames compared with T-CUP (see the inset of graph c of FIG. 2). Thus, CUSP dramatically surpasses the currently fastest single-shot imaging modality in terms of both temporal resolution and sequence depth. Graph d of FIG. 2 plots the reconstructed total light intensities of the five sub-pulses versus the illumination wavelength. Their profiles are close to the ground truth measured by a spectrometer (labeled "Ref" in graph d).

Figure 10:
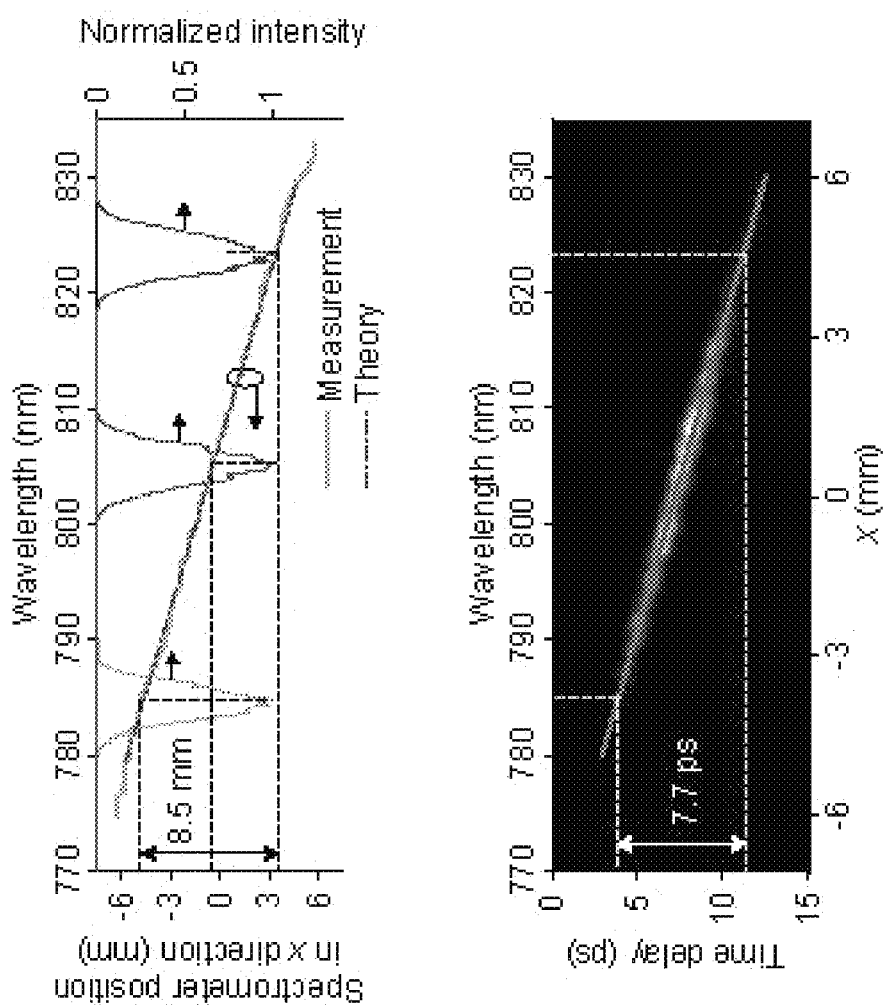
FIG. 10 illustrates spatial and temporal chirps generated by a grating pair in a CUSP system, according to an aspect.
Figure 10:
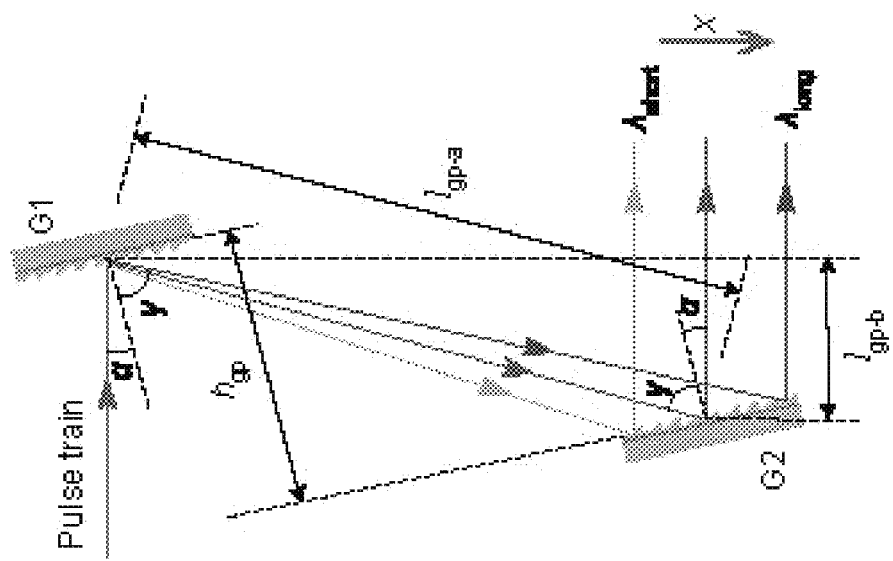

Schematic a of FIG. 10 provides another illustration of the grating pair G1 and G2 used in the imaging of an ultrafast linear optical phenomenon. Graph b of FIG. 10 shows the spatial chirp, measured by a fiber-coupled spectrometer. The solid line gives the peak wavelength of the measured spectrum as the spectrometer moves in the x direction, which matched closely with the theoretical prediction (the dashed-dotted line). Three exemplary spectrometer measurements are plotted in solid lines. Graph c of FIG. 10 shows the temporal chirp, as measured by direct streak camera imaging at 10 THz, with a test object formed from a 1D narrow slit in the x direction. Theoretical estimation is plotted in solid line. Within the bandwidth for imaging (785 nm to 823 nm), a positive chirp of 7.7 ps was measured.

IV. CUSP Active Mode Imaging of an Ultrafast Non-Linear Optical Phenomenon

As shown in FIG. 3, CUSP imaging system 100, configured in active mode (e.g., utilizing the illumination section 104), was used in imaging an ultrafast non-linear optical phenomenon.

Nonlinear light-matter interactions are indispensable in optical communications and quantum optics, among other fields. An example of a nonlinear light-matter interaction of interest is optical-field-induced birefringence, a result of a third-order nonlinearity. As shown in schematic a of FIG. 3, a single 48-fs laser pulse (referred to as the 'gate' pulse), centered at 800 nm and linearly polarized along the y direction, is focused into a $Bi_4Ge_3O_{12}$ (BGO) slab to induce transient birefringence. A second beam (referred to as the 'detection' pulse)—a temporally chirped pulse train from the illumination section 104 of the CUSP system 100—was focused on the slab from an orthogonal direction, going through a pair of linear polarizers P1 and P2 that sandwich the BGO. This is a Kerr gate setup since the two polarizers have polarization axes aligned at +45° and −45°, respectively. The Kerr gate has a finite transmittance of $T_{Kerr}=(1-\cos\varphi)/2$ only where the gate pulse travels. Here, $\varphi$, proportional to the gate pulse intensity, represents the gate-induced phase delay between the two orthogonal polarization directions x and y.

The CUSP imaging system 100 imaged the gate pulse, with a peak power density of $5.6\times10^{14}$ $mW/cm^2$ at its focus, propagating in the BGO slab. In the first and second experiments (graphs b and c of FIG. 3, respectively), the gate focus was outside and inside the field of view (FOV), respectively. Graphs b and c of FIG. 3 contain 3D visualizations of the reconstructed dynamics. Select frames from the reconstruction of the first experiment are shown in sequence d of FIG. 3 (the selected frames are outlined and identified in graph b). Select frames from the reconstruction of the second experiment are shown in sequence e of FIG. 3 (the selected frames are outlined and identified in graph c). As the gate pulse travels and focuses, the accumulated phase delay $\varphi$ increases, therefore $T_{Kerr}$ becomes larger. The centroid positions of the gate pulse (i.e. the transmission region in the Kerr medium) along the horizontal axis x versus time t are plotted at the bottom of graphs b and c, matching well with the theoretical estimation based on a refractive index of 2.62. Seven sub-pulses were included in the illumination to provide a 14-ps-long observation window and capture a total of 980 frames.

Re-distribution of electronic charges in BGO lattices driven by an intense light pulse, like in other solids, serves as the dominant mechanism underlying the transient birefringence, which is much faster than re-orientation of anisotropic molecules in liquids, such as carbon disulfide. To study this ultrafast process, one spatial location from sequence d of FIG. 3 was chosen to show its locally normalized transmittance evolution, which is plotted in graph f of FIG. 3. Its FWHM of 455 fs is close to the relaxation time of BGO reported in the literature.

In stark contrast with the pump-probe method, CUSP requires only one single laser pulse to observe the entire time course of its interaction with the material in 2D space. As discussed below, the Kerr gate in our experiment was designed to be highly sensitive to random fluctuations in the gate pulse intensity. The pump-probe measurements thus flicker conspicuously, due to shot-to-shot variations, while CUSP exhibits a smooth transmittance evolution, owing to single-shot acquisition. As discussed below in connection with FIG. 12, the fractional fluctuation in intensity is amplified 11 times in transmittance.

Figure 11:
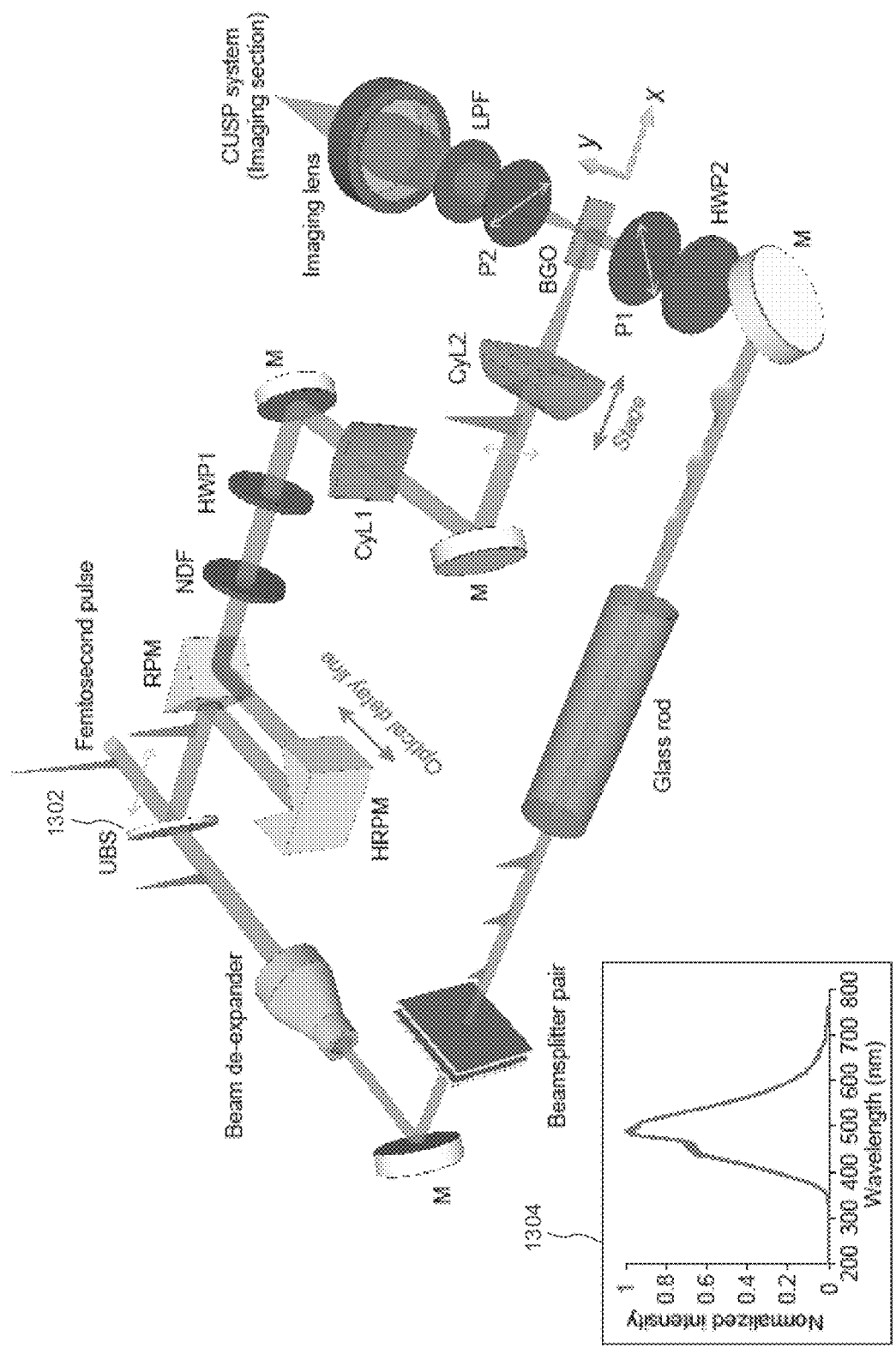
FIG. 11 is a schematic diagram of components of a compressed-sensing ultrafast spectral photography (CUSP) system configured for imaging ultrashort pulse propagation in a Kerr medium, according to certain implementations.

A detailed schematic of the Kerr gate setup is shown in FIG. 11. As shown in FIG. 11, original 48-fs pulse is horizontally polarized (x). It is split into the gate and detection arms by a beam splitter 1302 having a low or minimal group velocity dispersion (GVD).

In the gate arm, a hollow-roof prism mirror (HRPM) may be mounted on a high-precision motorized stage (that translates the HRPM along the "optical delay line") having a 300 nm step size (equivalently 2 fs in time delay). By moving the HRPM, the time delay between the gate and detection arms can be tuned. A half-wave-plate (HWP1) rotates the polarization to vertical (y). Two cylindrical lenses (CyL1 and CyL2) of different focal lengths reshape the round beam into an elliptical form and focus it into the BGO crystal. The short-focal-length lens (CyL2) may have motion control along the x direction to move the focal spot in and out of the field of view. In the detection arm, which was coupled with the illumination section 104 of the active CUSP system 100, the beam size is firstly shrunk by 2 times by a beam de-expander. Another half-wave-plate (HWP2) aligns the polarization angle of the detection light to that of the first polarizer's (P1) polarization axis. An N-SF11 rod of 95-mm long with a chirp parameter of $\eta=\eta_{rod\_2}=-52.7$ fs/nm was deployed for 70-Tfps imaging.

BGO is known for producing multi-photon-absorption induced fluorescence (MPF) since its 4.8 eV bandgap is close to the three-photon energy of the 800 nm light. We used a long-pass filter (LPF) to eliminate this undesired fluorescence. The measured spectrum shown in graph 1304 of FIG. 11 proves that the long-pass filter with 715 nm cut-off can effectively block the MPF.

The Kerr effect introduces transient birefringence inside the medium (BGO crystal). In other words, the refractive index along the polarization direction of the gate light (y) is changed linearly proportionally to the gate pulse intensity, $$\Delta n = \kappa |\vec{E}_{gate}|^2 = \kappa I_{gate}. \tag{6}$$

The nonlinearity coefficient K is proportional to the third-order susceptibility $\chi^{(3)}$. As a result, the detection light accumulates different phases between two orthogonal polarizations where it meets the gate pulse in the BGO. Since P2's and P1's polarization axes are orthogonal to each other in the Kerr gate setup, the transmittance of the Kerr gate is $$T_\perp = T_{Kerr} = \frac{1-\cos\varphi}{2}. \tag{7}$$

Here, $\varphi = k_{BGO} \Delta n l_{Kerr}$, in which $k_{BGO}$ is the angular wavenumber in BGO, and $l_{Kerr}$ is the interaction length between the gate pulse and the detection pulse. When the detection light meets the traveling gate pulse, $\varphi$ has a finite value, leading to high transmittance. When the detection misses the gate, $\varphi=0$, displaying a dark background $T_\perp=0$.

In order to measure the phase retardation $\varphi$, P2 was rotated to be aligned with P1. In this case, the transmittance after P2 becomes $$T_\parallel = \frac{1+\cos\varphi}{2}. \tag{8}$$

$\varphi=\pi/9$ was computed near the focus of the gate pulse with a peak power density of $5.6\times10^{14}$ $mW/cm^2$.

Taking the derivative of Equation (7) and considering that $\varphi$ is proportional to $I_{gate}$, we obtain the following relation:

$$\frac{dT_{Kerr}}{T_{Kerr}} = \frac{\varphi\sin\varphi}{1-\cos\varphi} \cdot \frac{dI_{gate}}{I_{gate}}. \tag{9}$$

Therefore, the fractional change of the Kerr gate transmittance is proportional to the fractional change of the gate pulse intensity. We define coefficient $A=(\varphi \sin \varphi)/(1-\cos \varphi)$, which is plotted in graph a of FIG. 12. In our Kerr gate, the phase retardation $\varphi$ ranges from 0 to $\pi/9$, where the transmittance is sensitive to random fluctuations in the gate pulse intensity.

In the experimental study, a total of 200 consecutive shots were captured while the time delay between the gate pulse and the detection pulse was fixed. Here, a single 48-fs pulse was used as the detection pulse. The transmittance profile varied dramatically with a relative change of 0.175 (standard deviation/mean, or SD/M for short) as shown in graph c of FIG. 12. A set of reference images were also taken when the gate pulse was blocked and the polarizers P1 and P2 were set parallel. These reference images directly measure the laser intensity fluctuation, showing a relative change of only 0.016. As shown in chart c of FIG. 12, the Kerr gate transmittance has SD/M 11 times as large as that of the reference intensity.

Such a high sensitivity to random fluctuations calls for single-shot ultrafast imaging, and conventional pump-probe imaging may not be applicable. Compared with CUSP and T-CUP, the pump-probe method displays a much noisier transmittance evolution. In a pump-probe measurement, one image is acquired for a preset time delay. Therefore, 980 independent acquisitions were used to observe the entire dynamics in graph b of FIG. 3. Since the fractional intensity fluctuation is 11 times greater than in CUSP, averaging over 121 images per time delay is required to compensate for the fluctuation. Therefore, pump-probe imaging needs $>10^5$ laser shots to acquire the dynamics with the same stability and sequence depth as CUSP. In other words, CUSP outperforms pump-probe imaging by $>10^5$ times in data acquisition throughput.

Figure 12:
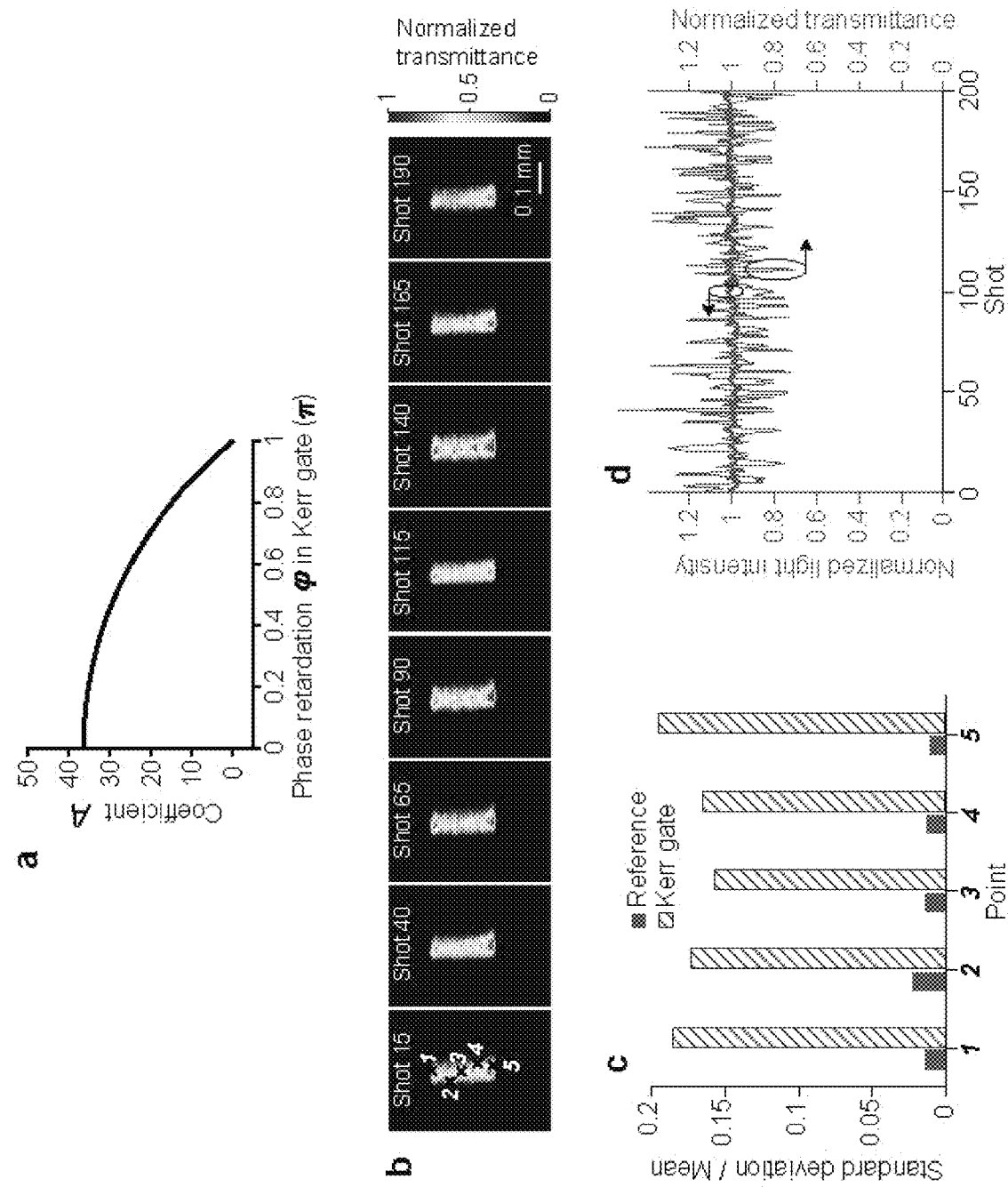
FIG. 12 illustrates data captured by a CUSP system, according to an aspect.

FIG. 12 also illustrates, in graph a, coefficient A connecting the fractional change of the gate pulse intensity to that of the Kerr gate transmittance. Image sequence b and graphs c and d show a study on the stability of the stability of the Kerr gate. In particular, image sequence b includes representative shots of the Kerr gate transmittance profile at a fixed time delay. Graph c shows relative change (standard deviation/mean) of the intensity from the reference experiment and that of the transmittance from the Kerr gate experiment, at five spatial points labelled in shot 15 of sequence b. Graph d shows sequences of intensity and transmittance from point 3, normalized to their mean values.

V. CUSP Passive Mode Imaging of an Ultrafast Fluorescence Phenomenon

In passive mode, CUSP provides four-dimensional (4D) spectral imaging at $0.5 \times 10^{12}$ fps, allowing the first single-shot spectrally resolved fluorescence lifetime imaging microscopy (SR-FLIM). As examples, the passive mode CUSP system may have a frame rate greater than $1 \times 10^{11}$ fps, greater than $2 \times 10^{11}$ fps, greater than $3 \times 10^{11}$ fps, greater than $4 \times 10^{11}$ fps, greater than or $5 \times 10^{11}$ fps (i.e., $0.5 \times 10^{12}$ fps, or 0.5 Tfps). Simultaneously with such framerates, the passive mode CUSP system may have a sequence depth of at least 100 frames, at least 200 frames, at least 300 frames, at least 400 frames, at least 500 frames, at least 600 frames, at least 700 frames, at least 800 frames, at least 900 frames, or at least 1,000 frames.

Both the emission spectrum and fluorescence lifetime are important properties of molecules, which have been exploited by biologists and material scientists to investigate a variety of biological processes and material characteristics. Over the past decades, time-correlated single photon counting (TCSPC) has been the gold-standard tool for SR-FLIM. Nonetheless, TCSPC typically takes tens of milliseconds to even seconds to acquire one dataset, since it depends on repeated measurements.

A schematic of a passive CUSP system configured for SR-FLIM is shown in diagram a of FIG. 4. The configuration includes a fluorescence microscope that interfaces with the imaging section 102 of the CUSP system 100. The system may also include a dichroic mirror (DM), a long-pass emission filter (EmF), a short-pass excitation filter (ExF), and other suitable optics. The dichroic mirror and the long-pass filter (EmF) effective blocked stray excitation light from passing to the imaging section 102 of the CUSP system 100.

The SR-FLIM system implemented with CUSP provides a spectral resolution of 13 nm over the 200-nm bandwidth. A single 532-nm picosecond pulse was deployed to excite fluorescence from a sample of Rhodamine 6G dye (Rh6G) in methanol. The Rh6G solution was masked by a negative USAF target, placed at the sample plane. Three Rh6G concentrations (22 mM, 36 mM and 40 mM) with three different spatial patterns were imaged and reconstructed at 0.5 Tfps. The final data contains $N_{tp}=400$ frames over an exposure time of 0.8 ns, and $N_\lambda=100$ wavelength samples. Fluorescence lifetime can be readily extracted by single-exponential fitting. 3D graphs b, c, and d of FIG. 4 illustrate the spatio-spectral distributions of the fluorescence lifetimes. Rh6G with a higher concentration has a shorter lifetime due to increased pathways for non-radiative relaxation. The spatial intensity distributions (insets of graphs b, c, and d) show well-preserved spatial resolutions. Graph e of FIG. 4 plots the intensity distribution of the 22-mM sample in the t–λ, space, clearly revealing that the emission peaks at ~570 nm and decays rapidly after excitation. We show in graph f that lifetimes remain relatively constant over the entire emission spectra and exhibit minute variations over the spatial domain. The grey bands in graph f represent the standard deviations of lifetimes in the spatial domain. These uniform spatial distributions are also confirmed by the spectrally averaged lifetime maps in graph g of FIG. 4.

Figure 13:
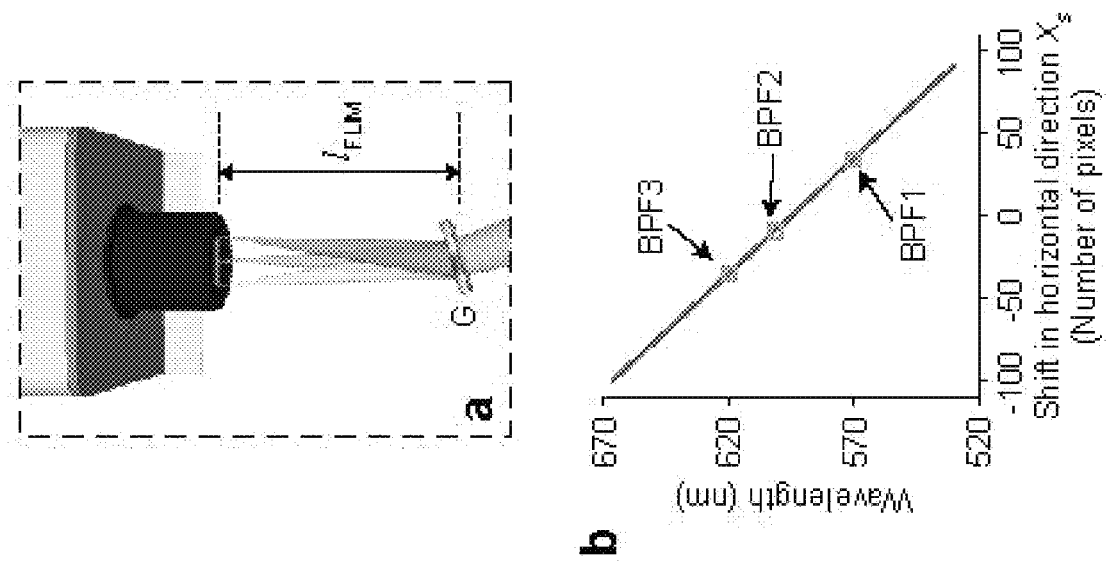
FIG. 13 is a schematic diagram of components of a passive compressed-sensing ultrafast spectral photography (CUSP) system, according to certain implementations.
Figure 13:
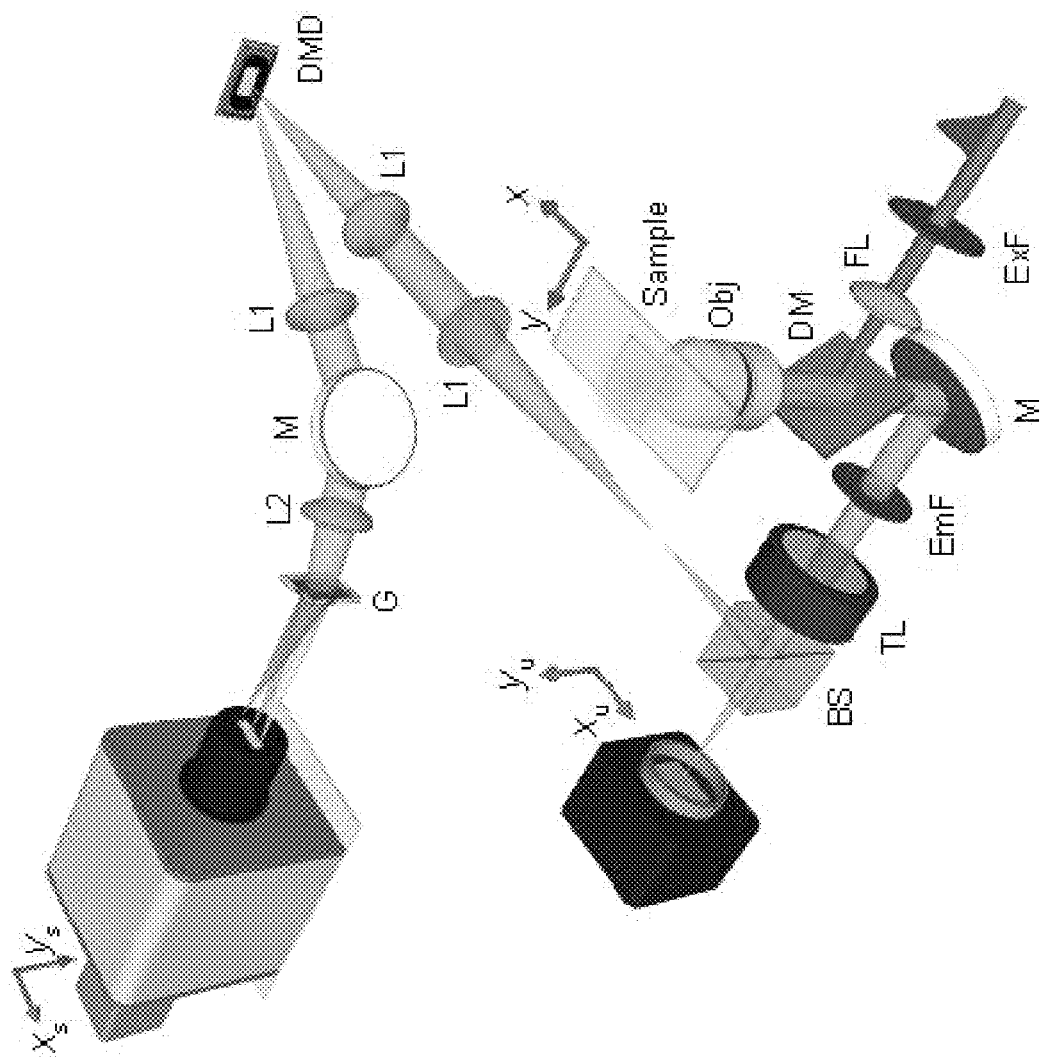

A schematic of the entire passive CUSP system for SR-FLIM is shown in FIG. 13. Fluorescence of short lifetimes is known to have low quantum efficiency. Therefore, it is useful to make use of all the emitted photons. The system shown in FIG. 13 differs from that of FIG. 1, in that the DMD is placed in retro-reflection, where the DMD is tilted by 12°. Each mirror in the DMD is configurable between a +12° ("ON") or −12° ("OFF") state, relative to the DMD's surface normal. In this modified system, two separate sets of optical lenses were used to project the image onto the DMD and then relay the encoded image from the DMD to the streak camera, respectively. The 50/50 (R/T) beam splitter of FIG. 1 was also replaced by beam splitter with a 90% reflectance and a 10% transmittance (to send more light towards the DMD). These changes harnesses 3.6×photons in s-View, compared with that in the FIG. 1 configuration. Similar to the active CUSP system, a diffraction grating of period $\Lambda_{FLIM}=1.667$ μm was inserted at a distance $l_{FLIM}=14$ mm from the entrance port of the streak camera (as shown in image a of FIG. 13).

VI. Data Acquisition

A. Passive Mode

FIG. 11 illustrates an example of one potential data acquisition process of a CUSP system, although other processes may be suitable for CUSP imaging. To simplify the explicit expressions for both u-View and s-View, we make the following assumptions, without loss of generality. First, the entire imaging system 100 has a magnification of 1×.

Second, the DMD 114, the external camera 112, and the internal camera of the streak camera 116 have the same pixel size, denoted as d, and their pixels are matched. Third, the scene is perfectly imaged to the DMD 114. To simplify the notations, we choose a voxel of (d, d, τ, δ), in the x-y-t-λ space, where τ=d/v and δ=d/|μ|. Here v is the temporal shearing speed of the streak camera and μ is the spectral dispersion parameter.

In u-View, the dynamic scene I(x, y, t, λ) (scene 106 of FIG. 1) is imaged on the external camera 114 through both low-pass filtering caused by the optical components, denoted as $F_u$, and spatiotemporal-spectrotemporal integration, denoted as T, $$I_{F_u}(x_u, y_u, t, \lambda) = F_u\{I(x, y, t, \lambda)\}, \tag{10}$$

$$E_u[m, n] = T\{Q_u(\lambda) \cdot I_{F_u}(x_u, y_u, t, \lambda)\} = \tag{11}$$

$$\int dx_u \int dy_u \left\{ \left[ \int dt \int d\lambda \ Q_u(\lambda) \cdot I_{F_u}(x_u, y_u, t, \lambda) \right] \cdot rect\left[ \frac{x_u}{d} - \left(m + \frac{1}{2}\right), \frac{y_u}{d} - \left(n + \frac{1}{2}\right) \right] \right\}.$$

In equation (10), $x_u$ and $y_u$ are the spatial coordinates of the external camera 112. In Equation (11), $E_u[m, n]$ represents the optical energy measured by the [m, n] pixel on the camera 112, and $Q_u(\lambda)$ is the quantum efficiency of the external camera 112.

In s-View, we firstly apply spatial encoding to I(x, y, t, λ) by a pseudo-random binary pattern C(x,y) displayed on the DMD 114, giving the following intensity distribution:

$$I_C(x,y,t,\lambda)=C(x,y)I(x,y,t,\lambda). \tag{12}$$

The encoded scene is then relayed to the entrance port of the streak camera 116 by passing through the imaging system (e.g., the optical components within imaging section 102), which also introduces spatial low-pass filtering $F_s$:

$$I_{F_s}(x,y,t,\lambda)=F_s\{I_C(x,y,t,\lambda)\}. \tag{13}$$

Next, an image distortion operator of the s-View is applied:

$$I_D(x,y,t,\lambda)=D\{I_{F_s}(x,y,t,\lambda)\}. \tag{14}$$

In the next step, the dynamic scene is spectrally dispersed by the diffraction grating 118 of FIG. 1. Here, we define an intermediate coordinate system right at the entrance port of the streak camera 116: x'=x+μ(λ−λ₀), y'=y. Hence, the dispersed image $I_{S_\lambda}$ is given by $$I_{S_\lambda}(x',y',t,\lambda)=S_\lambda\{I_D(x,y,t,\lambda)\}=I_D(x'-\mu(\lambda-\lambda_0),y',t,\lambda). \tag{15}$$

Afterward, the dispersed scene is captured by the streak camera 116. Here, the quantum efficiency $Q_s(\lambda)$ of the streak camera photocathode 516 of FIG. 5 kicks in so that the generated photoelectron energy is $$I_{phe}(x',y',t,\lambda)=Q_s(\lambda) \cdot I_{S_\lambda}(x',y',t,\lambda). \tag{16}$$

Here, the subscript "phe" stands for "photoelectrons". We define the spatial axes of the streak camera 116 as $x_s$=x' and $y_s$=y'+vt. Thus, the temporal shearing along the vertical spatial axis can be expressed by $$I_{S_t}(x_s,y_s,t,\lambda)=S_t\{I_{phe}(x',y',t,\lambda)\}=Q_s(\lambda) \cdot I_{S_\lambda}(x_s,y_s-vt,t,\lambda). \tag{17}$$

Finally, $I_{S_t}(x_s, y_s, t, \lambda)$ is imaged to an internal sensor 520 of FIG. 5 by spatiotemporal-spectrotemporal integration T. Akin to the u-View, the optical energy measured by the [m, n] pixel on the sensor 520 takes the form $$E_s[m, n] = T\{I_{S_t}(x_s, y_s, t, \lambda)\} = \tag{18}$$

$$\int dx \int dy \left\{ \left[ \int dt \ I_{S_t}(x_s, y_s, t, \lambda) \right] \cdot rect\left[ \frac{x_s}{d} - \left(m + \frac{1}{2}\right), \frac{y_s}{d} - \left(n + \frac{1}{2}\right) \right] \right\}.$$

Taking Equations (15)-(17) into (18), we get $$E_s[m, n] = \tag{19}$$

$$\int dx \int dy \left\{ \left[ \int dt \int d\lambda \ Q_s(\lambda) \cdot I_D(x_s - \mu(\lambda - \lambda_0), y_s - vt, t, \lambda) \right] \cdot rect\left[ \frac{x_s}{d} - \left(m + \frac{1}{2}\right), \frac{y_s}{d} - \left(n + \frac{1}{2}\right) \right] \right\}.$$

The image pixel value that is read out from the streak camera 116 is linearly proportional to the deposited optical energy $E_s$ (see, e.g. graph c of FIG. 6).

To use this model in a compressed sensing-based reconstruction algorithm, it is helpful to derive a discrete-to-discrete model by discretizing the dynamic scene:

$$I[m, n, k, q] = \tag{20}$$

$$\int d\lambda \int dt \int dx \int dy \ I(x, y, t, \lambda) \cdot rect\left[ \frac{x}{d} - \left(m + \frac{1}{2}\right), \frac{y}{d} - \left(n + \frac{1}{2}\right), \frac{t}{\tau} - \left(k + \frac{1}{2}\right), \frac{\lambda - \lambda_0}{\delta} - \left(q + \frac{1}{2}\right) \right].$$

In Equation (20), m, n, k, q are non-negative integers. Therefore, the measurement of the u-View can be approximated by $$E_u[m, n] = \frac{d^4}{v|\mu|} \sum_k \sum_q Q_u[q] \cdot (h_u * I)[m, n, k, q]. \tag{21}$$

Here, $h_u$ is the discrete convolution kernel of the operator $F_u$, and * stands for the discrete 2D spatial convolution operation.

For the s-View, the encoding mask is discretized to $$C[m, n] = \int dx \int dy \ C(x, y) \cdot rect\left[ \frac{x}{d} - \left(m + \frac{1}{2}\right), \frac{y}{d} - \left(n + \frac{1}{2}\right) \right]. \tag{22}$$

Then, the encoded scene becomes $$I_C[m,n,k,q]=C[m,n] \cdot I[m,n,k,q]. \tag{23}$$

Eventually, the discretized form of the streak camera measurement is represented by $$E_s[m, n] = \frac{d^4}{v|\mu|} \sum_k \sum_q Q_s[q] \cdot (h_s * I_C)[m_D - q, n_D - k, k, q], \tag{24}$$

where $h_s$ is the discrete convolution kernel of the operator $F_s$, $m_D$ and $n_D$ are the discrete coordinates transformed according to the distortion operator D.

B. Active Mode

In the passive version of CUSP, time and spectrum are independent, therefore we can directly apply the general model derived above. However, in active mode, spectrum and time are dependent because we use the spectrum for time stamping. Consequently, the general model should preferable be modified. To start with, the dynamic scene, illuminated by a train of chirped pulses, can be expressed by $$I(x,y,t)=I(x,y,pt_{sp}+\eta(\lambda-\lambda_0))=I(x,y,t(p,\lambda)). \quad (25)$$

We can still use Equation (20) as its discrete form, however, $k=\text{round}(pt_{sp}/\tau)$ is a non-negative integer that is assigned to the sub-pulse sequence p only.

For the u-View, Equations (10) and (11) are replaced by $$I_{F_u}(x_u, y_u, t(p, \lambda)) = F_u\{I(x, y, t(p, \lambda))\}, \quad (26)$$

$$E_u[m, n] = T\{Q_u(\lambda) \cdot I_{F_u}(x_u, y_u, t(p, \lambda))\} = \quad (27)$$

$$\int dx_u \int dy_u \left\{ \left[ \sum_p \int d\lambda \ Q_u(\lambda) \cdot I_{F_u}(x_u, y_u, t(p, \lambda)) \right] \cdot \text{rect}\left[\frac{x_u}{d} - \left(m + \frac{1}{2}\right), \frac{y_u}{d} - \left(n + \frac{1}{2}\right)\right] \right\}.$$

Therefore, the discrete-to-discrete model for this view can be adapted from Equation (21):

$$E_u[m, n] = \frac{d^4}{v|\mu|}\sum_p \sum_q Q_u[q] \cdot (h_u * I)[m, n, k(p), q], \quad (28)$$

where $k=\text{round}(pt_{sp}/\tau)$, p=0, 1, 2, ..., (P−1), and q=0, 1, 2, ..., $((N_{td}/P)-1)$. $N_{ta}$ is the number of recorded frames in the active mode.

For the s-View, we can basically follow the same derivation process from Equation (12) to (15), but replace t by $pt_{sp}$ and re-define the vertical axis of the streak camera as $y_s=y'+v(pt_{sp}+\eta(\lambda-\lambda_0))$. As a result, the optical energy received by the internal CCD is $$E_s[m, n] = \int dx \int dy \quad (29)$$

$$\left\{ \left[ \sum_p \int d\lambda \ Q_u(\lambda) \cdot I_D(x_s - \mu(\lambda - \lambda_0), y_s - v(pt_{sp} + \eta(\lambda - \lambda_0)), t(p, \lambda)) \right] \cdot \text{rect}\left[\frac{x_s}{d} - \left(m + \frac{1}{2}\right), \frac{y_s}{d} - \left(n + \frac{1}{2}\right)\right] \right\}.$$

Similarly, its discrete-to-discrete model is given by $$E_s[m, n] = \frac{d^4}{v|\mu|}\sum_p \sum_q Q_s[q] \cdot (h_s * I_C)[m_D - q, n_D - r(p, q), k(p), q], \quad (30)$$

in which $r = \text{round}[(pt_{sp} + \eta(\lambda - \lambda_0))/\tau] = \text{round}[(pt_{sp} + \eta q\delta)/\tau]$, $k = \text{round}(pt_{sp}/\tau)$, $p = 0, 1, 2, ...$, $(P - 1)$, and $q = 0, 1, 2, ..., ((N_{ta}/P) - 1)$.

VII. Additional Considerations

Modifications, additions, or omissions may be made to any of the above-described embodiments without departing from the scope of the disclosure. Any of the embodiments described above may include more, fewer, or other features without departing from the scope of the disclosure. Additionally, the steps of described features may be performed in any suitable order without departing from the scope of the disclosure. Also, one or more features from any embodiment may be combined with one or more features of any other embodiment without departing from the scope of the disclosure. The components of any embodiment may be integrated or separated according to particular needs without departing from the scope of the disclosure.

It should be understood that certain aspects described above can be implemented in the form of logic using computer software in a modular or integrated manner. Based on the disclosure and teachings provided herein, a person of ordinary skill in the art will know and appreciate other ways and/or methods to implement the present invention using hardware and a combination of hardware and software.

Any of the software components or functions described in this application, may be implemented as software code using any suitable computer language and/or computational software such as, for example, Java, C, C #, C++ or Python, LabVIEW, Mathematica, or other suitable language/computational software, including low level code, including code written for field programmable gate arrays, for example in VHDL. The code may include software libraries for functions like data acquisition and control, motion control, image acquisition and display, etc. Some or all of the code may also run on a personal computer, single board computer, embedded controller, microcontroller, digital signal processor, field programmable gate array and/or any combination thereof or any similar computation device and/or logic device(s). The software code may be stored as a series of instructions, or commands on a CRM such as a random access memory (RAM), a read only memory (ROM), a magnetic medium such as a hard-drive or a floppy disk, or an optical medium such as a CD-ROM, or solid stage storage such as a solid state hard drive or removable flash memory device or any suitable storage device. Any such CRM may reside on or within a single computational apparatus, and may be present on or within different computational apparatuses within a system or network. Although the foregoing disclosed embodiments have been described in some detail to facilitate understanding, the described embodiments are to be considered illustrative and not limiting. It will be apparent to one of ordinary skill in the art that certain changes and modifications can be practiced within the scope of the appended claims.

The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and can also cover other unlisted steps. Similarly, any composition or device that "comprises," "has" or "includes" one or more features is not limited to possessing only those one or more features and can cover other unlisted features.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member can be referred to and claimed individually or in any combination with other members of the group or other elements found herein. One or more members of a group can be included in, or deleted from, a group for reasons of convenience or patentability. When any such inclusion or deletion occurs, the specification is herein deemed to contain the group as modified thus fulfilling the written description of all Markush groups used in the appended claims.

What is claimed is:

1. A compressed-sensing ultrafast spectral photography (CUSP) system for obtaining a series of final recorded images of a subject, comprising:
   an illumination section comprising:
      first and second beam splitters configured to receive a first laser pulse and configured to convert the first laser pulse into a pulse train that comprises a plurality of sub-pulses evenly separated in time; and
      an optical component configured to temporally stretch and chirp each of the sub-pulses of the pulse train, wherein the illumination section is configured to illuminate an object of interest with the temporally-stretched and chirped sub-pulses of the pulse train to produce a first series of images; and
   an imaging section comprising:
      a spatial encoding module configured to receive the first series of images and to produce a second series of spatially-encoded images, each spatially-encoded image of the second series comprising at least a first view including one image of the first series superimposed with a pseudo-random binary spatial pattern; and
      a streak camera coupled to the spatial encoding module, the streak camera configured to receive the second series of spatially-encoded images, to deflect each spatially-encoded image by a temporal deflection distance that varies as a function of time-of-arrival, and to integrate the temporally-deflected images into a single raw CUSP image.

2. The CUSP system of claim 1, further comprising:
   an additional optical element optically disposed between the spatial encoding module and the streak camera, wherein the additional optical element is configured to spectrally disperse the second series of spatially-encoded images before images of the second series of spatially-encoded images are received by the streak camera.

3. The CUSP system of claim 2, wherein the streak camera is configured to deflect the second series of spatially-encoded images along a first axis, wherein the additional optical element is configured to spectrally disperse the second series of spatially-encoded images along a second axis, and wherein the first axis is orthogonal to the second axis.

4. The CUSP system of claim 3, wherein the additional optical element comprises a diffracting grating.

5. The CUSP system of claim 1, further comprising:
   a micrometer stage configured to adjust a spacing between the first beam splitter relative to the second beam splitter with a step size no greater than 600 nm.

6. The CUSP system of claim 1, wherein each of the first and second beam splitters comprise a beam splitter coating, wherein the beam splitter coating of the first beam splitter is on a surface of the first beam splitter that faces the second beam splitter, and wherein the beam splitter coating of the second beam splitter is on a surface of the second beam splitter that faces the first beam splitter.

7. The CUSP system of claim 1, wherein the raw CUSP image comprises an image comprises a time-sheared spectrally-dispersed spatially-encoded image.

8. The CUSP system of claim 1, further comprising:
   an additional beam splitter configured to divide the first series of images into first and second fractions, wherein the CUSP system is configured such that the first fraction is conveyed to the spatial encoding module; and
   an additional camera configured to receive the second fraction of the first series of images, the additional camera configured to temporally integrate the second fraction of the first series of images into an additional raw image.

9. The CUSP system of claim 1, wherein the streak camera comprises an entrance slit configured in a fully open position.

10. A compressed-sensing ultrafast spectral photography (CUSP) system for obtaining a series of final recorded images of a subject, comprising:
    a spatial encoding module configured to receive a first series of images and to produce a second series of spatially-encoded images, each spatially-encoded image of the second series comprising at least a first view including one image of the first series superimposed with a pseudo-random binary spatial pattern;
    an optical element configured to receive the second series of spatially-encoded images and to produce a third series of spatially-encoded and spectrally-dispersed images; and
    a streak camera configured to receive the third series of spatially-encoded and spectrally-dispersed images, to deflect each spatially-encoded and spectrally-dispersed image by a temporal deflection distance that varies as a function of time-of-arrival, and to integrate the temporally-deflected images into a single raw CUSP image.

11. The CUSP system of claim 10, wherein the optical element comprises a diffraction grating.

12. The CUSP system of claim 10, wherein the spatial encoding module comprises a digital micromirror device comprising an array of micromirrors.

13. The CUSP system of claim 10, further comprising:
    a beam splitter configured to divide the first series of images into first and second fractions, wherein the CUSP system is configured such that the first fraction is conveyed to the spatial encoding module; and
    an additional camera configured to receive the second fraction of the first series of images, the additional camera configured to temporally integrate the second fraction of the first series of images into an additional raw image.

14. A method of obtaining a series of final recorded images of an object using a compressed-sensing ultrafast spectral photography (CUSP) system, the method comprising:
    collecting a first series of images of the object;
    superimposing a pseudo-random binary spatial pattern onto each image of the first series to produce a second series of spatially-encoded images;
    dispersing each image of the second series of spatially-encoded images by spectrum to produce a third series of spatially-encoded and spectrally-dispersed images;

deflecting each spatially-encoded and spectrally-dispersed image of the third series by a temporal deflection distance that varies as a function of a time-of-arrival of each spatially-encoded image to produce a fourth series of time-sheared spatially-encoded, spectrally-dispersed images;

integrating and recording the fourth series of time-sheared spatially-encoded spectrally-dispersed images as a single raw CUSP image; and reconstructing a fifth series of final images by processing the single raw CUSP image according to an image reconstruction algorithm.

15. The method of claim 14, wherein the reconstructed fifth series of final images have a framerate of at least 40 trillion frames per second.

16. The method of claim 14, wherein the reconstructed fifth series of final images have a framerate of at least 70 trillion frames per second.

17. The method of claim 14, wherein the reconstructed fifth series of final images comprise single-shot spectrally resolved images at a framerate of at least $3 \times 10^{11}$ frames per second.

18. The method of claim 14, further comprising:

integrating and recording the first series of images as an additional raw image, wherein reconstructing the fifth series of final images by processing the single raw CUSP image according to the image reconstruction algorithm comprises processing the single raw CUSP image and the additional raw image according to the image reconstruction algorithm.

19. The method of claim 14, further comprising illuminating the object with a plurality of temporally-chirped laser pulses to create the first series of images of the object.

20. The method of claim 14, further comprising receiving a first laser pulse;

converting, with at least one beam splitter, the first laser pulse into a first pulse train that comprises a plurality of sub-pulses evenly separated in time;

temporally stretching and chirping each of the sub-pulses of the first pulse train; and illuminating the object with the temporally-stretched and chirped sub-pulses to create the first series of the images of the object.

21. The method of claim 14, further comprising splitting each image in the first series of images of the object into first and second fractions, wherein superimposing the pseudo-random binary spatial pattern onto each image of the first series to produce the second series of spatially-encoded images comprises superimposing the pseudo-random binary spatial pattern onto the first fraction of the first series of images of the object; and integrating and recording the second fraction of the first series of images of the object as an additional raw image, wherein reconstructing the fifth series of final images by processing the single raw CUSP image according to the image reconstruction algorithm comprises processing the single raw CUSP image and the additional raw image according to the image reconstruction algorithm.

22. The CUSP system of claim 1, wherein the spatial encoding module comprises a digital micromirror device.

23. The CUSP system of claim 22, wherein the digital micromirror device comprises an array of micromirrors.

* * * * *